(12) United States Patent
Radke

(10) Patent No.: US 12,324,130 B2
(45) Date of Patent: Jun. 3, 2025

(54) COMPONENT COOLER WITH SPRING MECHANISM

(71) Applicant: ADVANCED MICRO DEVICES, INC., Santa Clara, CA (US)

(72) Inventor: Robert Edward Radke, Austin, TX (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 195 days.

(21) Appl. No.: 17/956,813

(22) Filed: Sep. 29, 2022

(65) Prior Publication Data
US 2024/0114664 A1  Apr. 4, 2024

(51) Int. Cl.
*H05K 7/20* (2006.01)
*F16F 1/18* (2006.01)
*G06F 1/20* (2006.01)
*H01L 23/473* (2006.01)
*H01L 23/40* (2006.01)

(52) U.S. Cl.
CPC .............. *H05K 7/2049* (2013.01); *F16F 1/18* (2013.01); *G06F 1/20* (2013.01); *H01L 23/473* (2013.01); *H05K 7/20254* (2013.01); *G06F 2200/201* (2013.01); *H01L 2023/4081* (2013.01); *H05K 7/20272* (2013.01)

(58) Field of Classification Search
CPC .................................................. H05K 7/2049
See application file for complete search history.

(56) References Cited

U.S. PATENT DOCUMENTS

| | | | | |
|---|---|---|---|---|
| 4,607,492 A | * | 8/1986 | Demus | .................... F16C 29/00 267/164 |
| 6,542,365 B2 | * | 4/2003 | Inoue | .................... H01L 23/473 361/689 |
| 7,240,722 B2 | | 7/2007 | Lai et al. | |
| 7,298,618 B2 | * | 11/2007 | Campbell | ............ H05K 7/2079 174/15.1 |
| 7,400,504 B2 | * | 7/2008 | Campbell | ............ H05K 7/2079 165/80.4 |
| 7,408,776 B1 | * | 8/2008 | Campbell | .......... H05K 7/20509 257/E23.098 |
| 7,591,302 B1 | | 9/2009 | Lenehan et al. | |
| 7,639,498 B2 | * | 12/2009 | Campbell | .......... H05K 7/20772 165/80.4 |

(Continued)

FOREIGN PATENT DOCUMENTS

| | | |
|---|---|---|
| DE | 202008013995 U1 | 12/2008 |
| EP | 0498753 A2 * | 8/1992 ......... H01L 23/4336 |

(Continued)

OTHER PUBLICATIONS

International Search Report and Written Opinion, PCT/US2023/073736, Dec. 14, 2023, 11 pages.

(Continued)

*Primary Examiner* — Robert J Hoffberg

(57) ABSTRACT

An apparatus for component cooling includes a manifold and a heat transfer element configured to be thermally coupled to a heat-generating component. The apparatus further includes a first spring mechanism between the manifold and the heat transfer element. The first spring mechanism is configured to apply a first force to the heat transfer element.

19 Claims, 17 Drawing Sheets

(56) References Cited

U.S. PATENT DOCUMENTS

| | | | |
|---|---|---|---|
| 7,830,664 B2* | 11/2010 | Campbell | G06F 1/20 |
| | | | 165/80.4 |
| 8,668,189 B2* | 3/2014 | Guthrie | F16F 1/18 |
| | | | 267/164 |
| 9,313,919 B2 | 4/2016 | Aoki et al. | |
| 10,694,638 B1 | 6/2020 | Lin et al. | |
| 10,775,861 B2 | 9/2020 | North et al. | |
| 11,547,022 B2 | 1/2023 | Gao | |
| 2003/0183269 A1 | 10/2003 | Maeda et al. | |
| 2006/0090474 A1 | 5/2006 | Sauciuc et al. | |
| 2006/0278372 A1 | 12/2006 | Lai et al. | |
| 2007/0091570 A1* | 4/2007 | Campbell | H05K 7/2079 |
| | | | 361/699 |
| 2007/0234740 A1 | 10/2007 | Lee et al. | |
| 2008/0052428 A1 | 2/2008 | Liang et al. | |
| 2008/0084668 A1* | 4/2008 | Campbell | H05K 7/20509 |
| | | | 257/E23.098 |
| 2008/0184710 A1 | 8/2008 | DeVilbiss | |
| 2008/0259567 A1* | 10/2008 | Campbell | H01L 23/473 |
| | | | 257/E23.098 |
| 2010/0101756 A1 | 4/2010 | Chu et al. | |
| 2011/0320055 A1 | 12/2011 | Yamachi | |
| 2014/0237815 A1* | 8/2014 | Lau | H01L 23/16 |
| | | | 29/829 |
| 2015/0233647 A1 | 8/2015 | Quisenberry et al. | |
| 2016/0033974 A1 | 2/2016 | North et al. | |
| 2017/0038805 A1 | 2/2017 | Chun | |
| 2017/0191709 A1 | 7/2017 | Chen et al. | |
| 2018/0004259 A1 | 1/2018 | Kulkarni et al. | |
| 2020/0363104 A1 | 11/2020 | MacDonald et al. | |
| 2021/0045254 A1* | 2/2021 | Zhang | H05K 1/18 |
| 2021/0084791 A1* | 3/2021 | Bucher | H05K 7/205 |
| 2022/0007541 A1 | 1/2022 | Shaw et al. | |
| 2022/0113757 A1 | 4/2022 | Yan et al. | |
| 2022/0167526 A1* | 5/2022 | Xu | H05K 7/20418 |
| 2022/0214730 A1 | 7/2022 | Navarro et al. | |
| 2022/0256684 A1 | 8/2022 | Gao | |
| 2022/0369517 A1 | 11/2022 | Gao | |
| 2023/0009853 A1 | 1/2023 | Kim et al. | |
| 2023/0083995 A1 | 3/2023 | Wang et al. | |
| 2024/0057296 A1 | 2/2024 | Gary et al. | |
| 2024/0111269 A1 | 4/2024 | Jaggers et al. | |
| 2024/0111343 A1 | 4/2024 | Pratapgarhwala et al. | |
| 2024/0111344 A1 | 4/2024 | Austin et al. | |
| 2024/0114646 A1 | 4/2024 | Jaggers et al. | |
| 2024/0114657 A1 | 4/2024 | Helberg et al. | |
| 2024/0114658 A1 | 4/2024 | Helberg et al. | |

FOREIGN PATENT DOCUMENTS

| | | |
|---|---|---|
| EP | 1679744 A1 | 7/2006 |
| KR | 20190035151 A | 4/2019 |
| WO | 2024073225 A1 | 4/2024 |
| WO | 2024073227 A1 | 4/2024 |

OTHER PUBLICATIONS

International Search Report and Written Opinion, PCT/US2023/073762, Jan. 3, 2024, 13 pages.

\* cited by examiner

COMPONENT COOLER WITH SPRING MECHANISM

BACKGROUND

Computing devices include various components, including processors and graphics processing units (GPUs) that generate heat. To dissipate the heat generated by such components, computing devices often include one or more cooling elements. Such cooling elements include, for example, fluid-cooled systems, heat pipes, vapor chambers, heat sinks, fans, and the like.

DETAILED DESCRIPTION

Figure 1:
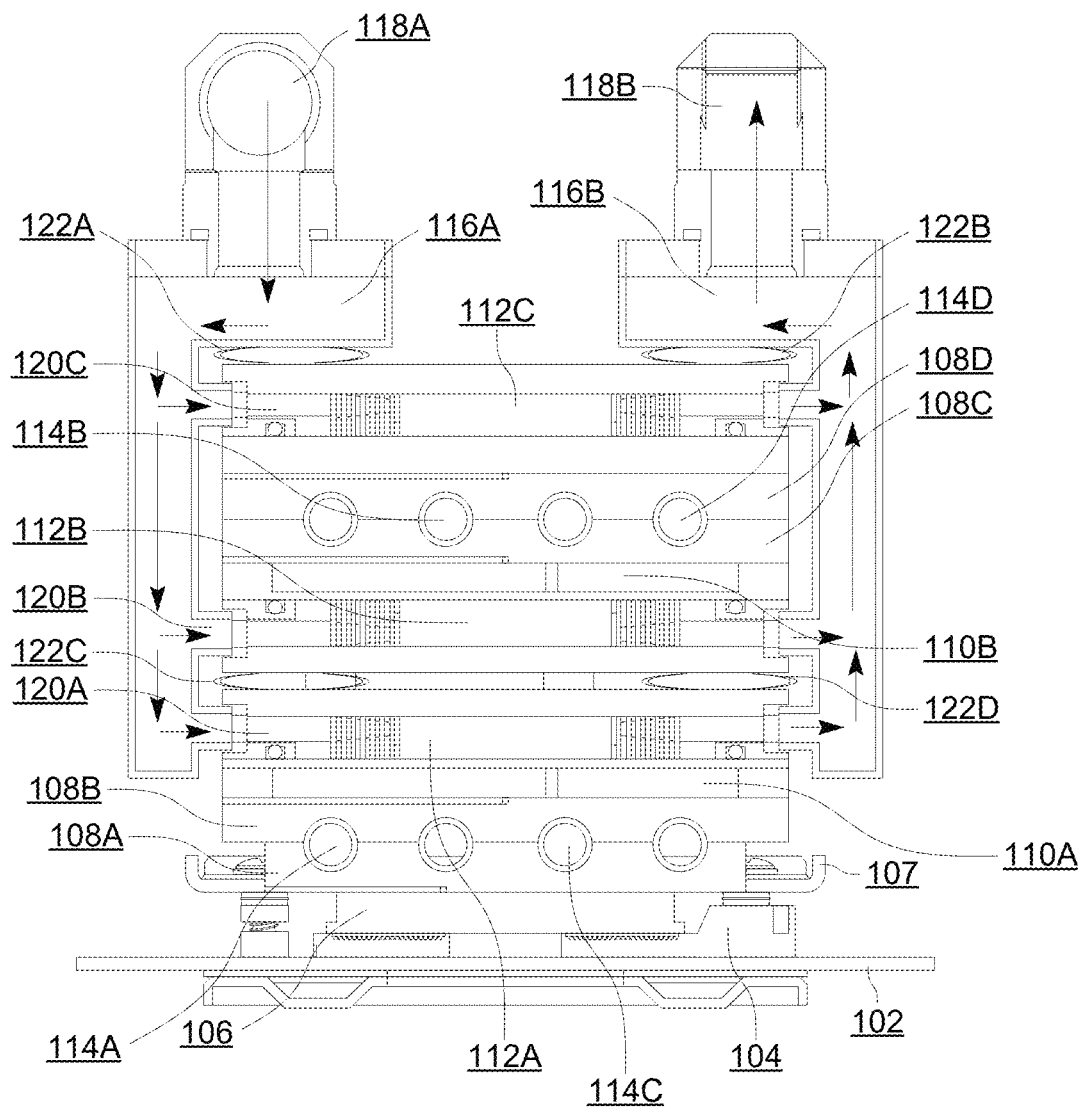
FIG. 1 is a diagram of a non-limiting example component cooling apparatus according to some implementations of the present disclosure.

Removing heat from an integrated circuit (IC), such as a central processing unit (CPU), accelerated processing unit (APU), a graphics processing unit (GPU), application specific IC (ASIC), field programmable gate array (FPGA), or the like, is becoming more difficult with an increased demand for greater processing power. A continuous push exists to increase power consumption and power density in ICs. For example, in processors, higher power consumption often correlates to higher performance. In addition, as processor technology advances, the number and density of transistors in a processor generally increase, resulting in faster and more power efficient processors. As transistor density increases, heat generation is more concentrated in an area and removal of heat from the processor becomes more difficult. Similar advances are occurring in other types of ICs which result in similar concentrated and increased heat generation.

Thermal cooling solutions are usually employed to assist in heat removal from components of a computing device such as ICs. Maintaining a cooler IC potentially equates to higher performance. More efficient thermal solutions (such as a cooler) for removing heat typically result in lower IC temperatures. Computing devices often include one or more cooling elements to dissipate heat generated by various ICs, such as processor cores. Such cooling elements include, for example, heat sinks, fluid cooling systems (e.g., water cooling systems), vapor chambers, heat pipes, fans, and the like to conduct heat generated by ICs of the computing device to fans that dissipate the heat out of the computing device. However, existing solutions may not adequately cool components of a computing system due to utilizing ambient temperature air to cool and/or lack of sufficient thermal contact between heat generating components and heat dissipating components.

This specification sets forth a component cooler for a computing device. In one or more implementations, the component cooler utilizes multiple heat pipes to split a heat load generated by a component, through multiple conduction paths between multiple heat transfer elements to facilitate heat removal from the component. The component cooler includes multiple fluid flow paths across multiple surfaces to facilitate heat removal from the component. The component cooler can also incorporate one or more thermoelectric coolers (TECs) in contact with one or more of the heat transfer elements to provide sub-ambient cooling to the heat transfer elements and facilitate heat removal from the component.

The component cooler may also utilize thermal control features to control aspects of the operation of the component cooler to facilitate heat removal from the component. In some aspects, the component cooler includes one or more spring mechanisms attached to a manifold. The springs apply force to one or more heat transfer elements (e.g., cold plates). The force applied to the heat transfer element causes the heat transfer element to maintain thermal contact with a mating surface (such as a base plate of a heat pipe assembly). Accordingly, more effective and efficient cooling of components within a computing device is provided by using spring mechanisms to apply force to increase the thermal contact between heat generating components and heat dissipating components.

An apparatus for component cooling that utilizes such spring mechanisms is described herein. The apparatus includes a manifold, a heat transfer element configured to be thermally coupled to a heat-generating component, and a first spring mechanism between the manifold and the heat transfer element. The first spring mechanism is configured to apply a first force to the heat transfer element. The heat transfer element comprises a cold plate.

The first spring mechanism is attached to a liquid cooling manifold of the apparatus. The manifold, in some implementations, includes a fluid passage configured to provide a heat transfer medium through the heat transfer element. The first spring mechanism is attached to an inlet portion of the manifold and extends along a portion of a first edge of the heat transfer element. The first spring mechanism, in some implementations, is a leaf spring.

The apparatus may also include a second spring mechanism between the manifold and the heat transfer element. The second spring mechanism is configured to apply a second force to the heat transfer element. The second spring mechanism is attached to the outlet portion of the manifold. The second spring mechanism extends along a portion of a second edge of the first heat transfer element. The first and second spring mechanism apply force in the same direction to the heat transfer element, pressing the heat transfer element against a heat generating component or a base plate of heat pipe assembly.

In some implementations, the first and second spring mechanisms have substantially a same width and spring constant such that the distance between the manifold outlet portion and the heat transfer element is substantially equal to the distance between the manifold outlet portion and the heat transfer element when the first and second spring mechanisms are installed and compressed.

Another apparatus for component cooling is described herein that includes a first heat transfer element configured to be thermally coupled to a heat-generating component, a second heat transfer element, and a first spring mechanism between the first heat transfer element and the second heat transfer element. One or more of the first heat transfer element and the second heat transfer element comprises a cold plate.

The first spring mechanism is configured to apply a first force to the first heat transfer element and a second force to the second heat transfer element. The first force is in an opposite direction to the second force. The first force presses the first heat transfer element against the heat-generating component. The first spring mechanism is attached to the manifold and extends along a portion of a first edge of the heat transfer element.

The apparatus also includes a second spring mechanism between the first heat transfer element and the second heat transfer element. The second spring mechanism is configured to apply a third force to the first heat transfer element and a fourth force to the second heat transfer element. The second force presses the second heat transfer element against a base plate. The second spring mechanism extends along a portion of a second edge of the heat transfer element.

In some implementations, the first spring mechanism is attached to a manifold at a first end and comprises a tapered end opposite to the first end. The first spring mechanism also comprises a width, when uncompressed, greater than a distance of a space between the first and second heat transfer elements. The tapered end is adapted to enter the space between the first and second heat transfer elements during installation of the manifold. The first spring mechanism positions the first and second heat transfer elements when compressed, after the tapered end is completely within the space.

Also described herein is another apparatus for component cooling that includes a manifold, a first heat transfer element, and a first spring mechanism between the manifold and the first heat transfer element. The first spring mechanism is configured to apply a first force to the first heat transfer element and a second force to the manifold. The apparatus also includes a second heat transfer element configured to be thermally coupled to a heat-generating component, and a second spring mechanism between the first heat transfer element and the second heat transfer element. The second spring mechanism is configured to apply a third force to the first heat transfer element and a fourth force to the second heat transfer element. The first spring mechanism and the second spring mechanism are attached to the manifold.

The present disclosure also describes a method for component cooling. The method includes providing a manifold, providing a first heat transfer element, and providing a first spring mechanism between the manifold and the first heat transfer element. The first spring mechanism is configured to apply a first force to the heat transfer element and a second force to the manifold. The method also includes providing a second heat transfer element configured to be thermally coupled to a heat-generating component, and providing a second spring mechanism between the first heat transfer element and the second heat transfer element, the second spring mechanism configured to apply a third force to the first heat transfer element and a fourth force to the second heat transfer element.

The present disclosure also sets forth a method of assembling a component cooling apparatus. The method includes inserting, on a first side, a tapered end of a first spring mechanism into an opening between cold plates. The tapered end of the first spring mechanism is opposite to an end attached to a first manifold portion. The method also includes inserting, on a second side opposite the first side, a tapered end of a second spring mechanism into an opening between the cold plates. The tapered end of the second spring mechanism is attached to a second manifold portion.

Various implementations of a component cooling apparatus are described with reference to drawings beginning with FIG. 1. FIG. 1 is a diagram of a non-limiting example component cooling apparatus 100 according to some implementations of the present disclosure. The example component cooling apparatus 100 of FIG. 1 is shown in a cross-sectional view. The example component cooling apparatus 100 can be implemented in a variety of computing devices including desktop computing devices, mobile computing devices, laptops, tablets, hybrid laptop/tablet computing devices, gaming devices, set top boxes, and the like.

The example component cooling apparatus 100 of FIG. 1 includes a substrate 102. The substrate 102 of FIG. 1 may be a printed circuit board (PCB) such as a motherboard of a computing device. The substrate 102 is coupled to an IC socket 104 which is further coupled to a bottom surface of a processor 106. A processor is used here as an example of a heat generating component, but readers of skill in the art will recognize that components that could benefit from the example cooling apparatus described in this specification can include any type of IC. In various examples, the processor 106 includes a CPU, an APU, a GPU, an FPGA, an ASIC, or a digital signal processor (DSP).

A top surface of the processor 106 is thermally coupled to a bottom surface of a first base plate 108A. A base plate is a component of a heat pipe assembly through which various heat pipes conduct heat. The first base plate 108A is connected to the substrate 102 via a mounting plate 107. A top surface of the first base plate 108A is coupled to a bottom surface of a second base plate 108B. The first base plate 108A and the second base plate 108B may be constructed of a conductive metal, such as copper. In some implementations, the first base plate 108A and the second base plate 108B are replaced with a single base plate.

A top surface of the second base plate 108B is thermally coupled to a bottom surface of a first thermoelectric cooler (TEC) 110A. A TEC is a semiconductor device having two sides which function to transfer heat from one side to the other when current is passed through the TEC. A top surface of the first TEC 110A is thermally coupled to a first cold plate 112A. A cold plate is a device that uses a fluid to transfer heat from a device to a remote heat exchanger. Although various implementations are described as using cold plates as heat transfer elements, in other implementations, other suitable heat transfer elements are used such as base plates or heatsinks.

The component cooling apparatus 100 also includes a second cold plate 112B having a top surface thermally coupled to a bottom surface of a second TEC 110B. A top surface of the second TEC 110B is thermally coupled to a bottom surface of a third base plate 108C. A top surface of third base plate 108C is coupled to a bottom surface of a fourth base plate 108D. The third base plate 108C and the fourth base plate 108D are constructed of a conductive metal such as copper. In an implementation, the third base plate 108C and the fourth base plate 108D are replaced with a single base plate.

The component cooling apparatus of FIG. 1 also includes a third cold plate 112C having a bottom surface thermally coupled to a top surface of the fourth base plate 108D. In an implementation, each of the first cold plate 112A, the second cold plate 112B, and the third cold plate 112C include a plurality of fins to facilitate transfer of heat to a heat transfer medium such as air of a fluid.

The component cooling apparatus 100 also includes multiple heat pipes 114A, 114B, 114C, and 114D. Each of the heat pipes 114A-114D has a first end disposed between and in thermal contact with the first base plate 108A and the second base plate 108B, and a second end disposed between and in thermal contact with the third base plate 108C and the fourth base plate 108D. Each of the heat pipes 114A, 114B, 114C, and 114D include a middle portion between the first end and the second end that is external to each of the base plates 108A, 108B, 108C, and 108D. In one or more implementations, each of the heat pipes 114A, 114B, 114C, and 114D are formed in a half-loop configuration as further illustrated in FIG. 2. In the implementation illustrated in FIG. 1, the heat pipes 114A-114D have a substantially circular cross section. In a particular implementation, the heat pipes 114A and 114C extend from a side of the component cooling apparatus 100, and the heat pipes 114B and 114D extend from an opposite side of the component cooling apparatus 100. Although various implementations are described as using heat pipes as heat transfer structures, other implementations may utilize other suitable heat transfer structures such as, for example, vapor chambers.

The component cooling apparatus 100 also includes a fluid manifold. The fluid manifold includes a manifold inlet portion 116A and a manifold outlet portion 116B disposed on opposing sides of the component cooling apparatus 100. The manifold inlet portion 116A includes a fluid inlet 118A, and the manifold outlet portion 116B includes a fluid outlet 118B. In an implementation, the fluid inlet 118A and the fluid outlet 118B are each positioned in opposite directions. In other implementations, the fluid inlet 118A and the fluid outlet 118B are each positioned in the same or any direction.

The fluid manifold includes a first fluid passage 120A extending from the manifold inlet portion 116A to the manifold outlet portion 116B. The first fluid passage 120A is in thermal contact with the first cold plate 112A. The fluid manifold includes a second fluid passage 120B extending from the manifold inlet portion 116A to the manifold outlet portion 116B and in thermal contact with the second cold plate 112B. The fluid manifold also includes a third fluid passage 120C extending from the manifold inlet portion 116A to the manifold outlet portion 116B and in thermal contact with the third cold plate 112C. During operation of the component cooling apparatus 100, a fluid loop that includes a fluid pump and a radiator (not shown) is coupled between the fluid inlet 118A and the fluid outlet 118B via tubing or the like. The fluid pump causes a flow of a cooling fluid within the fluid manifold into the manifold inlet portion 116A. The cooling fluid is split through each of the first fluid passage 120A, the second fluid passage 120B, and the third fluid passage 120C. The separate flows are merged within the manifold outlet portion 116B and output from the fluid outlet 118B to the radiator.

In an implementation, the flow of fluid through each of the first fluid passage 120A, the second fluid passage 120B, and the third fluid passage 120C is varied by constructing the sizes of one or more the first fluid passage 120A, second fluid passage 120B, and the third fluid passage 120C to be different from one another to achieve a desired flow rate through each of the fluid passages 120A, 120B, and 120C. In a particular example, the first fluid passage 120A is sized to have a greater flow rate than the second fluid passage 120B and the third fluid passage 120C due to an expectation of the amount of heat transferred to the first fluid passage 120A being greater than that of the second fluid passage 120B and the third fluid passage 120C. In an implementation, a diameter of the first fluid passage 120A is greater than that of the second fluid passage 120B or the third fluid passage 120C. In another implementation, one or more controllable valves are positioned within one or more of the first fluid passage 120A, the second fluid passage 120B, and the third fluid passage 120C to allow varying of the flow rates through the fluid passages. Although the implementation illustrated in FIG. 1 includes three fluid passages, other implementations have less than three or more than three fluid passages within the fluid manifold.

The component cooling apparatus 100 includes a first spring mechanism 122A and second spring mechanism 122B. The first spring mechanism 122A is disposed between the manifold inlet portion 116A and the third cold plate 112C. The first spring mechanism 122A is rigidly coupled to a sidewall of the manifold inlet portion 116A and exerts a first upward force to the manifold inlet portion 116A and a first downward force to the third cold plate 112C. The terms 'upward' and 'downward' are used here for ease of explanation only and are relative to the example depicted in FIG. 1. The second spring mechanism 122B is disposed between the manifold outlet portion 116B and the third cold plate 112C. The second spring mechanism 122B is rigidly coupled to a sidewall of the manifold outlet portion 116B and exerts a second upward force to the manifold outlet portion 116B and a second downward force to the third cold plate 112C. The force exerted by the first and second spring mechanisms to third cold plate 112C, cause the third cold plate maintain thermal contact with the fourth base plate 108D. In the implementation of FIG. 1, the first and second spring mechanisms are positioned on opposing ends of the third cold plate 112C and press the third cold plate towards the fourth base plate 108D. Being on opposing ends, the force applied to the third cold plate by both springs is effectively balanced and causes the third cold plate to be pressed against (and thermally coupled to) the fourth base plate in a relatively equal distribution across the surface area of the third cold plate and fourth base plate.

The component cooling apparatus 100 of FIG. 1 also includes a third spring mechanism 122C and a fourth spring mechanism 122D disposed between the second cold plate 112B and the first cold plate 112A. The third spring mechanism 122C and the fourth spring mechanism 122D are configured to exert a force between the first cold plate 112A and the second cold plate 112B to maintain thermal contact between the first cold plate 112A and the first TEC 110A, and maintain thermal contact between the second cold plate 112B and the second TEC 110B.

Each of the first spring mechanism 122A, the second spring mechanism 122B, the third spring mechanism 122C, and the fourth spring mechanism 122D are coupled to a side portion of fluid manifold. In the implementation illustrated in FIG. 1, the first spring mechanism 122A and the third spring mechanism 122C are coupled to a side of the manifold inlet portion 116A, and the second spring mechanism 122B and the fourth spring mechanism 122D are coupled to a side of the manifold outlet portion 116B. In various implementations, the spring mechanisms 122A-122D include one or more of, for example, a leaf spring, a coil spring, a pneumatic (e.g., a gas and/or fluid) spring, or a flat spring.

The third spring mechanism 122C has a rigid coupling to the sidewall of the manifold inlet portion 116A and exerts an upward force to the second cold plate 112B and a downward force to the first cold plate 112A. Similarly, the fourth spring mechanism 122D has a rigid coupling to the sidewall of the manifold outlet portion 116B and exerts an upward force to the second cold plate 112B and a downward force to the first cold plate 112A. As a result, thermal contact is maintained between the first cold plate 112A and the first TEC 110A, and between the second cold plate 112B and the second TEC 110B.

Typical thermal solutions that utilize spring mechanisms to maintain thermal contact between surfaces do not rigidly attach the spring mechanism to a surface. As a result, maintaining positioning of the spring mechanisms during assembly of the component cooler is more difficult. In addition, the spring mechanisms are more likely to become displaced during use of the component cooler when not rigidly attached to a surface. In the component cooler of FIG. 1, the rigid coupling of the first spring mechanism 122A, the second spring mechanism 122B, the third spring mechanism 122C, and the fourth spring mechanism 122D to the fluid manifold facilitates easier assembly of the component cooler apparatus 100. In an example implementation, the first spring mechanism 122A, the second spring mechanism 122B, the third spring mechanism 122C, and the fourth spring mechanism 122D are rigidly attached to the fluid manifold prior to installation of the cold plates 112A-112C so that the position of the spring mechanisms are maintained during assembly. In addition, the rigid coupling of the spring mechanisms to the fluid manifold assists in maintaining the positions of the spring mechanism during use of the component cooler apparatus 100.

In this example, the spring mechanisms all have substantially the same widths and spring constant so that the distance between the two objects upon which the spring mechanism exerts a force is substantially the same. A spring constant defines a ratio of the force affecting a spring to the displacement caused by the spring. When two springs have the same spring constant and width, the two springs will exert substantially the same force on two objects of similar mass, creating the same distance between the two objects. For example, the first spring mechanism 122A has a width and spring constant that is substantially similar to that of the third spring mechanism 122C. As such, the distance between the manifold inlet portion 116A and the third cold plate 112C (maintained by the first spring mechanism's force), is substantially equivalent to the distance between the second cold plate 112B and the first cold plate 112A (maintained by the second spring mechanism's force). The widths and spring constant of the spring mechanisms may be selected so that, when the spring mechanisms are compressed, the distances between cold plates, and between manifold portions and cold plates, may provide various sized gaps according to desired thermal characteristics. Larger gaps, for example, provide additional airflow across surfaces (such as the cold plate surfaces) which, in some cases, results in additional cooling through greater heat dissipation relative to a smaller gap. In other cases, a smaller gap between two components (such as two cold plates) may result in additional cooling efficiency of the components.

The example component cooling apparatus 100 of FIG. 1 provides for multiple heat conduction paths between heat transfer elements for removal of heat generated by the processor 106 as further described below. During operation of the processor 106, an amount of heat generated by the processor is transferred to the first base plate 108A thermally coupled to the processor 106, and a portion of the heat transferred to the first base plate 108A is further transferred to the second base plate 108B. Each of the heat pipes 114A, 114B, 114C, and 114D is configured to transfer a portion of the heat received from the first base plate 108A and the second base plate 108B to the third base plate 108C and the fourth base plate 108D. In a particular implementation, the heat pipes 114A, 114B, 114C, and 114D employ a phase transition between a heat transfer fluid within the heat pipes 114A, 114B, 114C, and 114D to transfer heat from the first base plate 108A and the second base plate 108B to the third base plate 108C and the fourth base plate 108D.

The first TEC 110A is controlled to remove an amount of heat from the second base plate 108B and transfer the heat to the first cold plate 112A. In an implementation, the amount of heat transferred by the first TEC 110A is controlled by adjusting a current provided to the first TEC 110A. The first TEC 110A provides sub-ambient temperature cooling to the second base plate 108B. The second TEC 110B is controlled to remove an amount of heat from the third base plate 108C and transfer the heat to the second cold plate 112B. The amount of heat transferred by the second TEC 110B is controlled by adjusting a current provided to the second TEC 110B. The second TEC 110B provides sub-ambient temperature cooling to the third base plate 108C. In one or more implementations, the amount of power provided to one or more of the first TEC 110A or the second TEC 110B is adapted based on monitored system parameters, such as processor activity, to control the amount of cooling provided by the respective TEC.

A fluid pump (not shown) causes a flow of a cooling fluid to enter the manifold inlet portion 116A through the fluid inlet 118A. The fluid is split to flow through each of the first fluid passage 120A, the second fluid passage 120B, and the third fluid passage 120C. The first fluid passage 120A is in thermal contact with the first cold plate 112A, the second fluid passage 120B is in thermal contact with the second cold plate 112B, and the third fluid passage 120C is in thermal contact with the third cold plate 112C. As fluid flows through the first fluid passage 120A, a portion of heat is transferred to the fluid from the first cold plate 112A. Similarly, as fluid flows through the second fluid passage 120B, a portion of heat is transferred to the fluid from the second cold plate 112B. As fluid flows through the third fluid passage 120C a portion of heat is transferred to the fluid from the third cold plate 112C. The separate flows from each of the first fluid passage 120A, the second fluid passage 120B, and the third fluid passage 120C are merged within the manifold outlet portion 116B and output from the fluid outlet 118B to one or more radiators (not shown).

Figure 2:
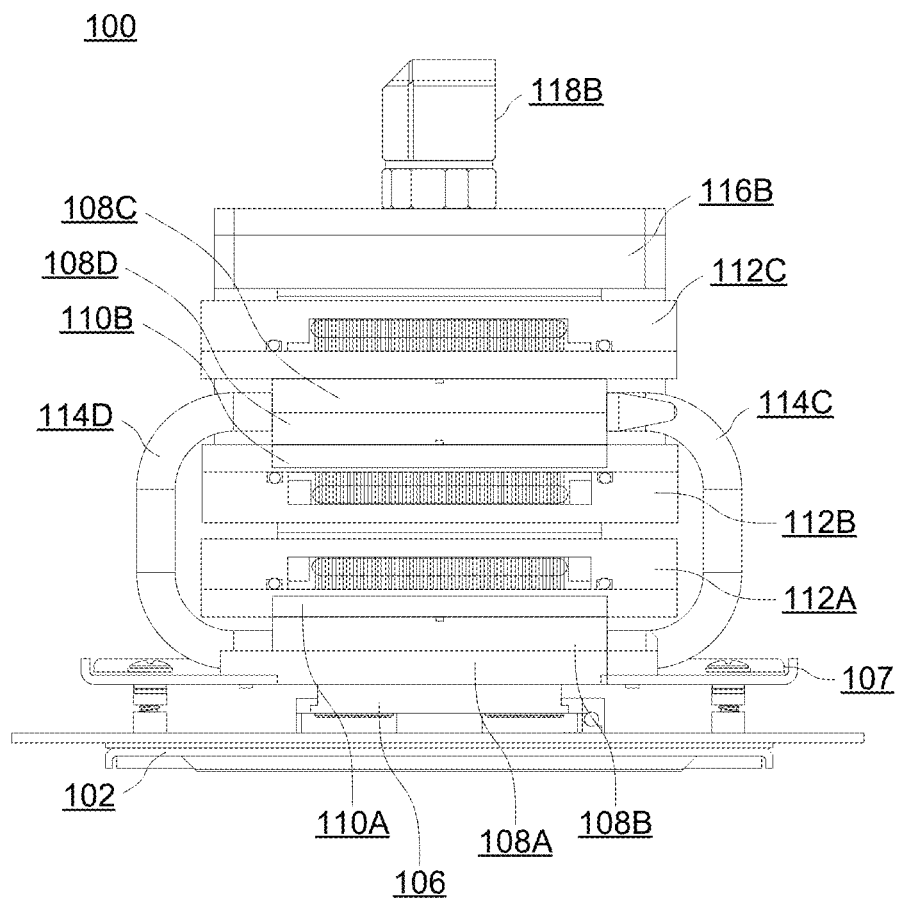
FIG. 2 is a side view of the component cooling apparatus of FIG. 1 according to implementations of the present disclosure.

For further explanation, FIG. 2 shows a side view of the component cooling apparatus 100 of FIG. 1 according to implementations of the present disclosure. FIG. 2 shows the heat pipes 114A, 114B, 114C, and 114D formed in a loop configuration. A first end of each of the heat pipes 114A, 114B, 114C, and 114D are in thermal contact with the first base plate 108A and the second base plate 108B. A second end of each of the heat pipes 114B, 114C, and 114D are in thermal contact with the third base plate 108C and the fourth base plate 108D.

Figure 3:
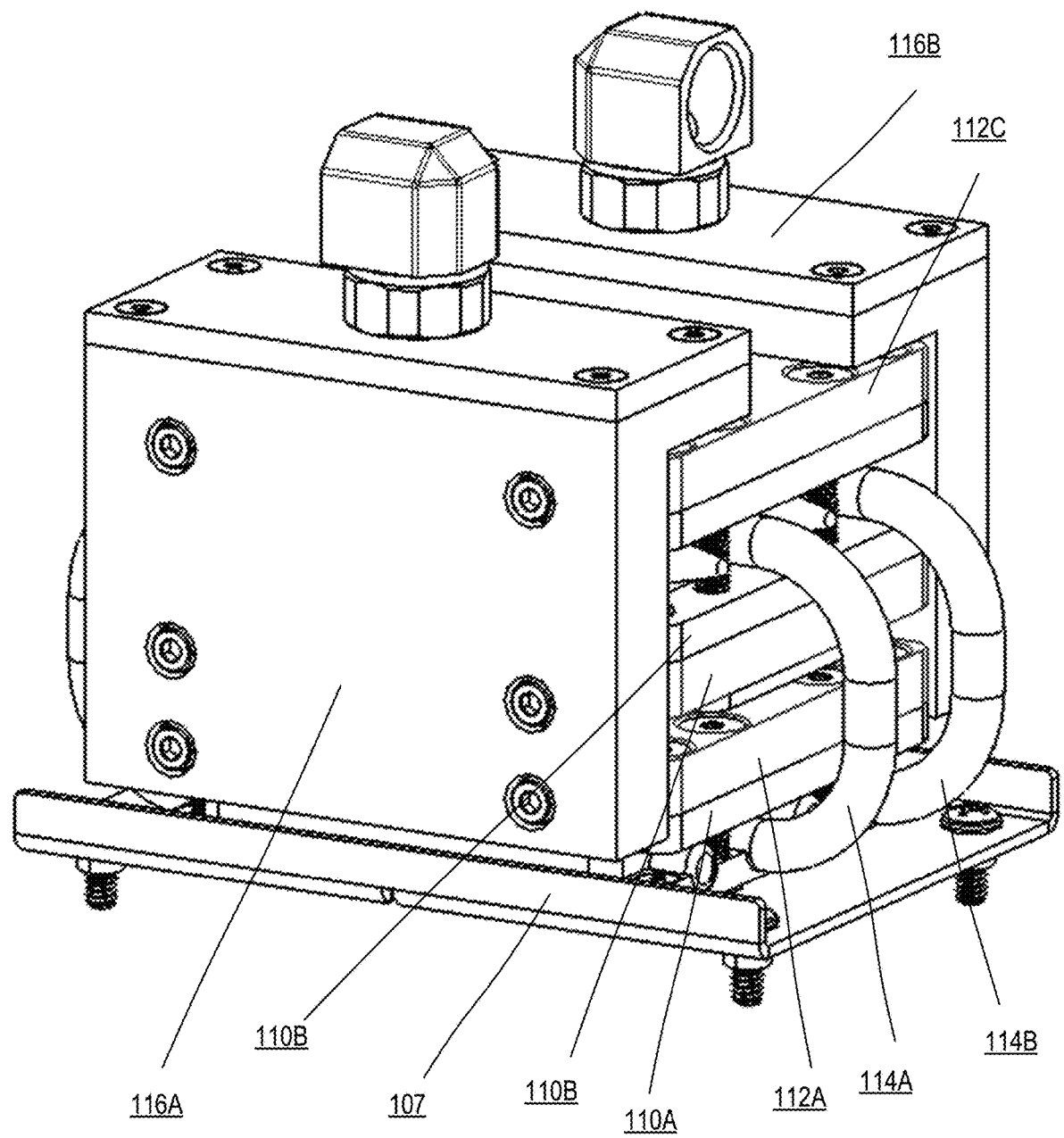
FIG. 3 is a perspective view of a portion of the component cooling apparatus of FIG. 1 according to implementations of the present disclosure.

For further explanation, FIG. 3 shows a perspective view of a portion of the component cooling apparatus 100 of FIG. 1 according to implementations of the present disclosure. FIG. 3 shows the component cooling apparatus uncoupled from the processor 106 and the substrate 102.

Figure 4:
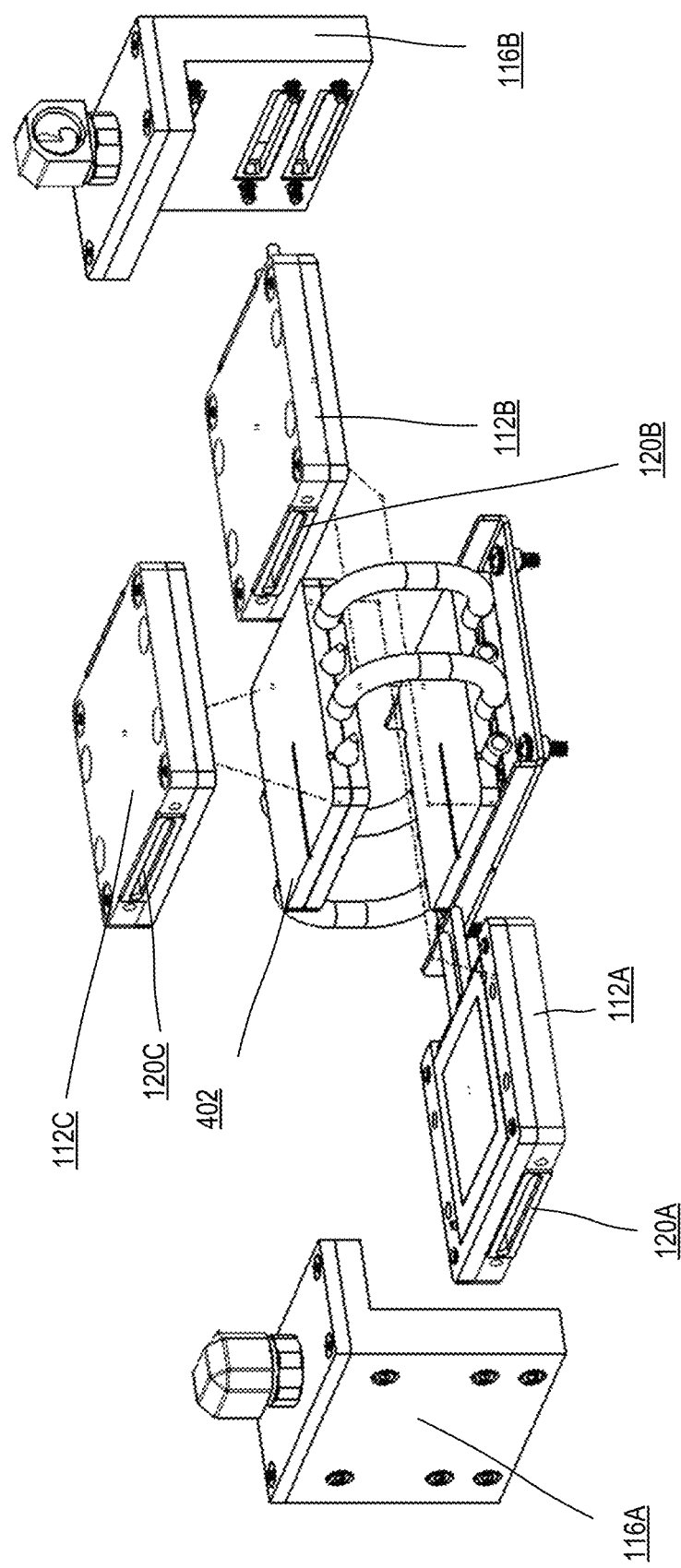
FIG. 4 is an exploded view of the portion of the component cooling apparatus of FIG. 3 according to implementations of the present disclosure.

For further explanation, FIG. 4 shows an exploded view of the portion of the component cooling apparatus of FIG. 3 according to implementations of the present disclosure. FIG. 4 shows the manifold inlet portion 116A and the manifold outlet portion 116B disconnected from the first cold plate 112A, the second cold plate 112B, and the third cold plate 112C. FIG. 4 further shows the first cold plate 112A, the second cold plate 112B, and the third cold plate 112C disconnected from the heat pipe assembly 402. The heat pipe assembly includes the heat pipes 114A-114D and base plates 108A-108D illustrated in FIG. 1. FIG. 4 further shows the first fluid passage 120A through the first cold plate 112A, the second fluid passage 120B through the second cold plate 112B, and the third fluid passage 120C through the third cold plate 112C.

Figure 5:
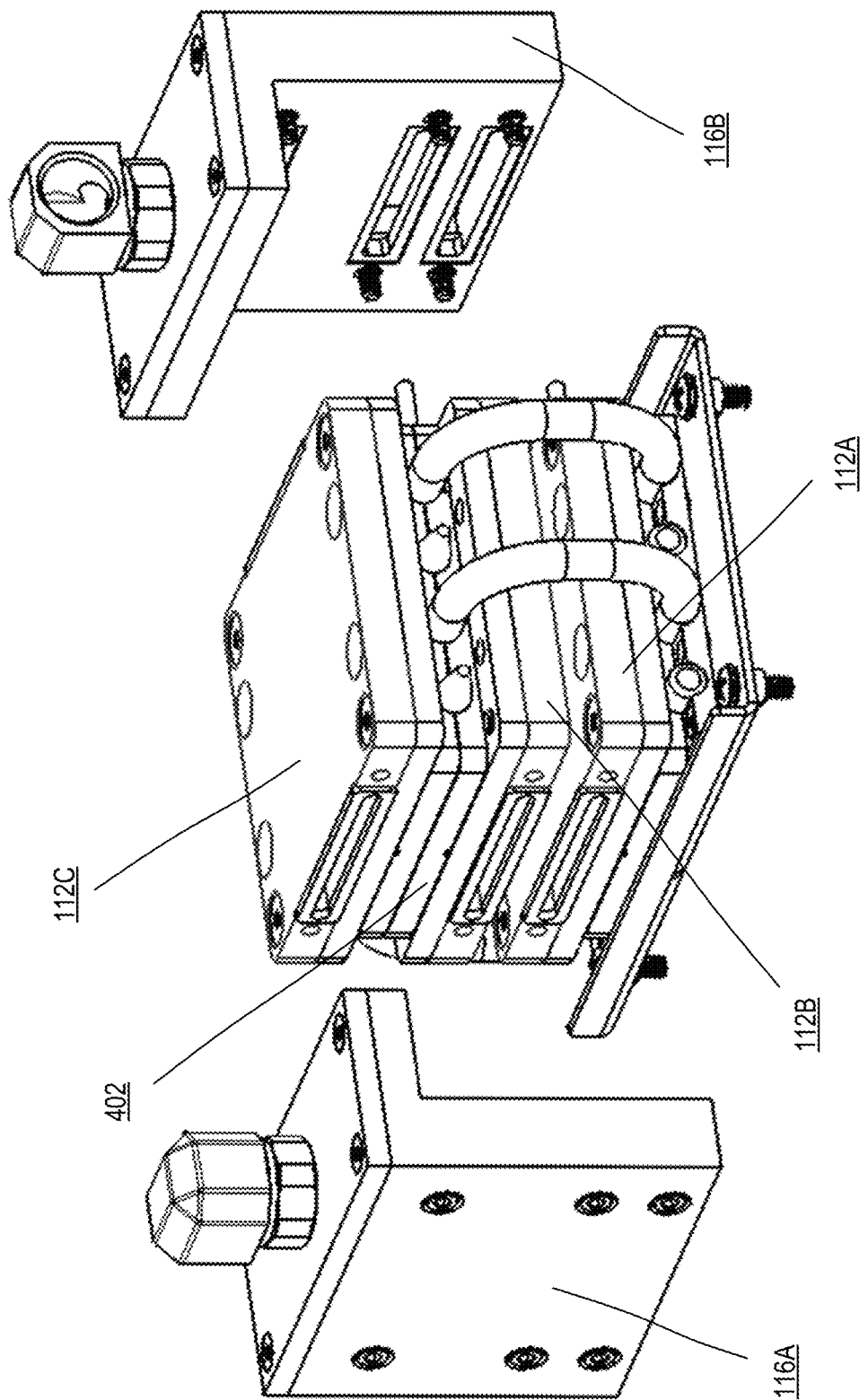
FIG. 5 is another exploded view of the portion of the component cooling apparatus of FIG. 3 according to implementations of the present disclosure.

For further explanation, FIG. 5 shows another exploded view of the portion of the component cooling apparatus of FIG. 3 according to implementations of the present disclosure. FIG. 5 shows the manifold inlet portion 116A and the manifold outlet portion 116B disconnected from the first cold plate 112A, the second cold plate 112B, and the third cold plate 112C. FIG. 5 further shows the first cold plate 112A, the second cold plate 112B, and the third cold plate 112C coupled to the heat pipe assembly 402.

Figure 6:
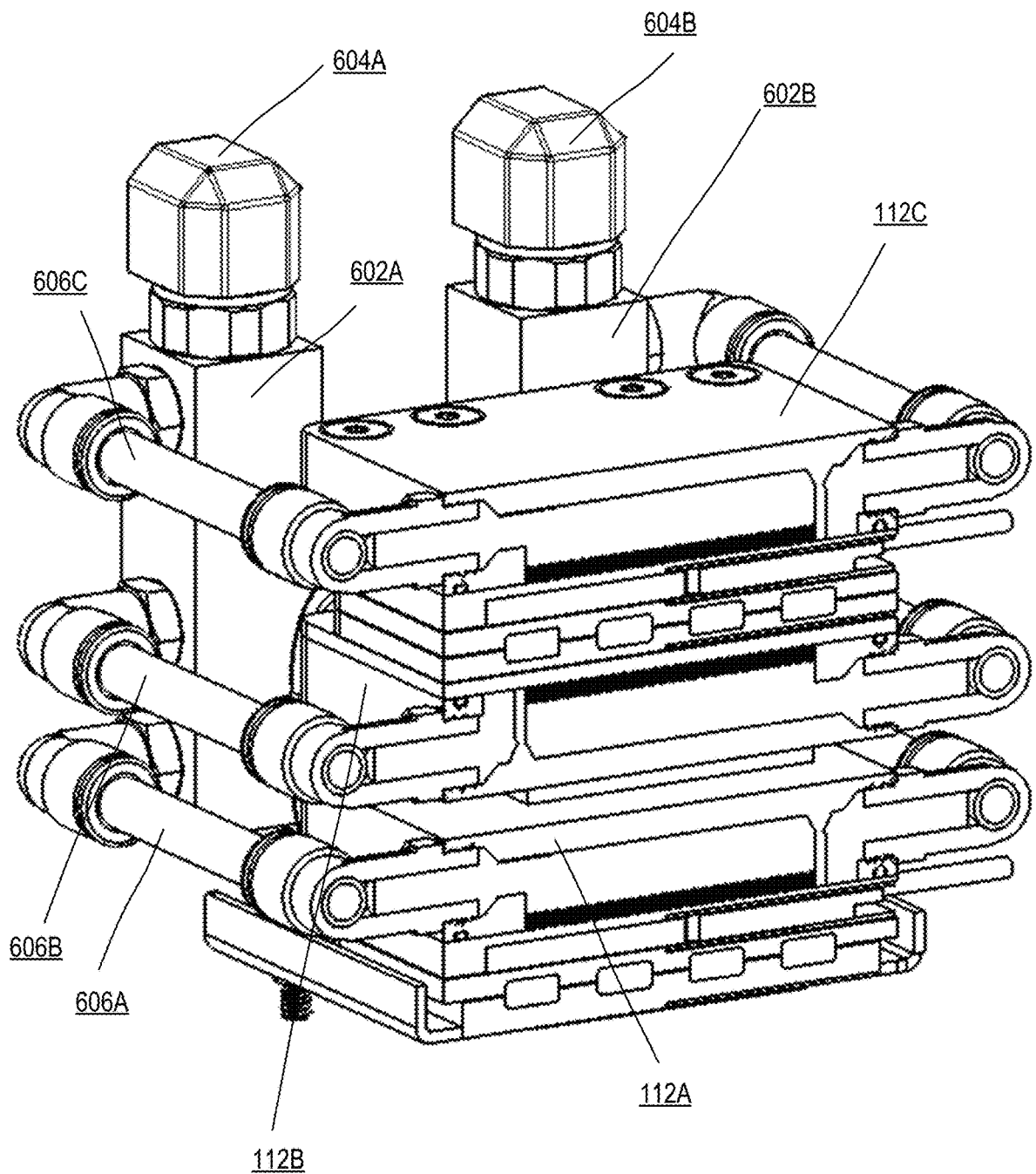
FIG. 6 is an implementation of a fluid manifold according to implementations of the present disclosure.

For further explanation, FIG. 6 shows another implementation of a fluid manifold 600 according to implementations of the present disclosure. FIG. 6 shows a cross-section view of the fluid manifold 600 as including a manifold inlet portion 602A and a manifold outlet portion 602B. The manifold inlet portion 602A includes a fluid inlet 604A, and the manifold outlet portion 602B includes a fluid outlet 604B. In an implementation, the fluid inlet 604A and the fluid outlet 604B are each positioned in the same direction. In other implementations, the fluid inlet 604A and the fluid outlet 604B are each positioned in any desired direction. The fluid manifold includes a first fluid passage 606A connecting the manifold inlet portion 602A to the manifold outlet portion 116B and in thermal contact with the first cold plate 112A. The fluid manifold includes a second fluid passage 606B connecting the manifold inlet portion 602A to the manifold outlet portion 602B and in thermal contact with the second cold plate 112B. The fluid manifold further includes a third fluid passage 606C connecting the manifold inlet portion 602A to the manifold outlet portion 602B and in thermal contact with the third cold plate 112C. In the implementation shown in FIG. 6, the manifold inlet portion 602A and the manifold outlet portion 602B are positioned behind and not in direct contact with the first cold plate 112A, the second cold plate 112B, and the third cold plate 112C.

Figure 7:
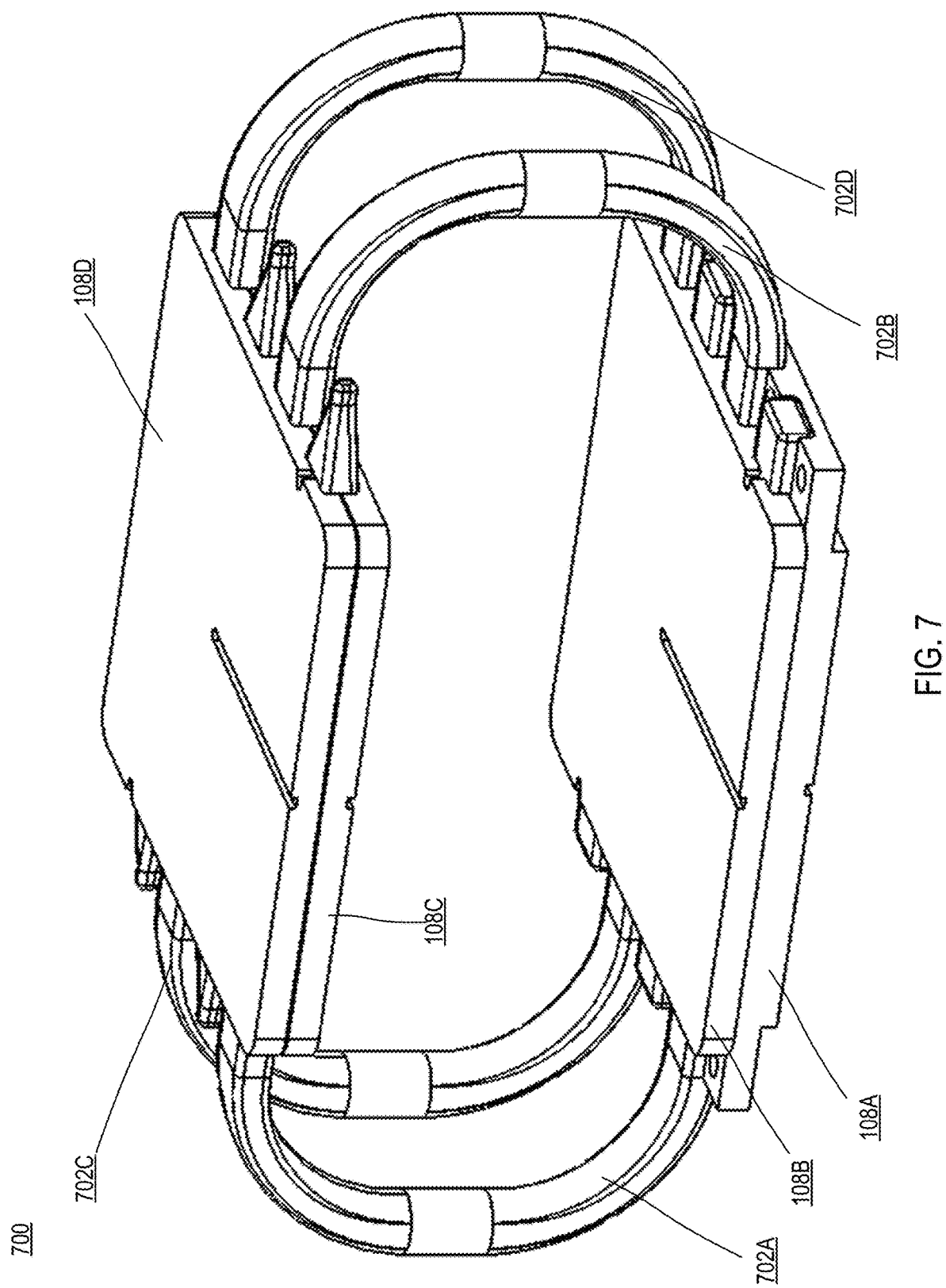
FIG. 7 is an implementation of a heat pipe assembly according to implementations of the present disclosure.

For further explanation, FIG. 7 shows another implementation of a heat pipe assembly 700 according to implementations of the present disclosure. The heat pipe assembly 700 includes a first heat pipe 702A, a second heat pipe 702B, a third heat pipe 702C, a fourth heat pipe 702D, the first base plate 108A, the second base plate 108B, the third base plate 108C, and the fourth base plate 108D. In the implementation illustrated in FIG. 7, the heat pipes 702A-702D have a substantially rectangular cross section. Each of the heat pipes 702A-702D include a first end in thermal contact with the first base plate 108A and the second base plate 108B, and a second end in thermal contact with the third base plate 108C and the fourth base plate 108D. Although various implementations show heat pipes having substantially circular and substantially rectangular cross sections, other implementations include heat pipes having any suitable cross-section.

Figure 8:
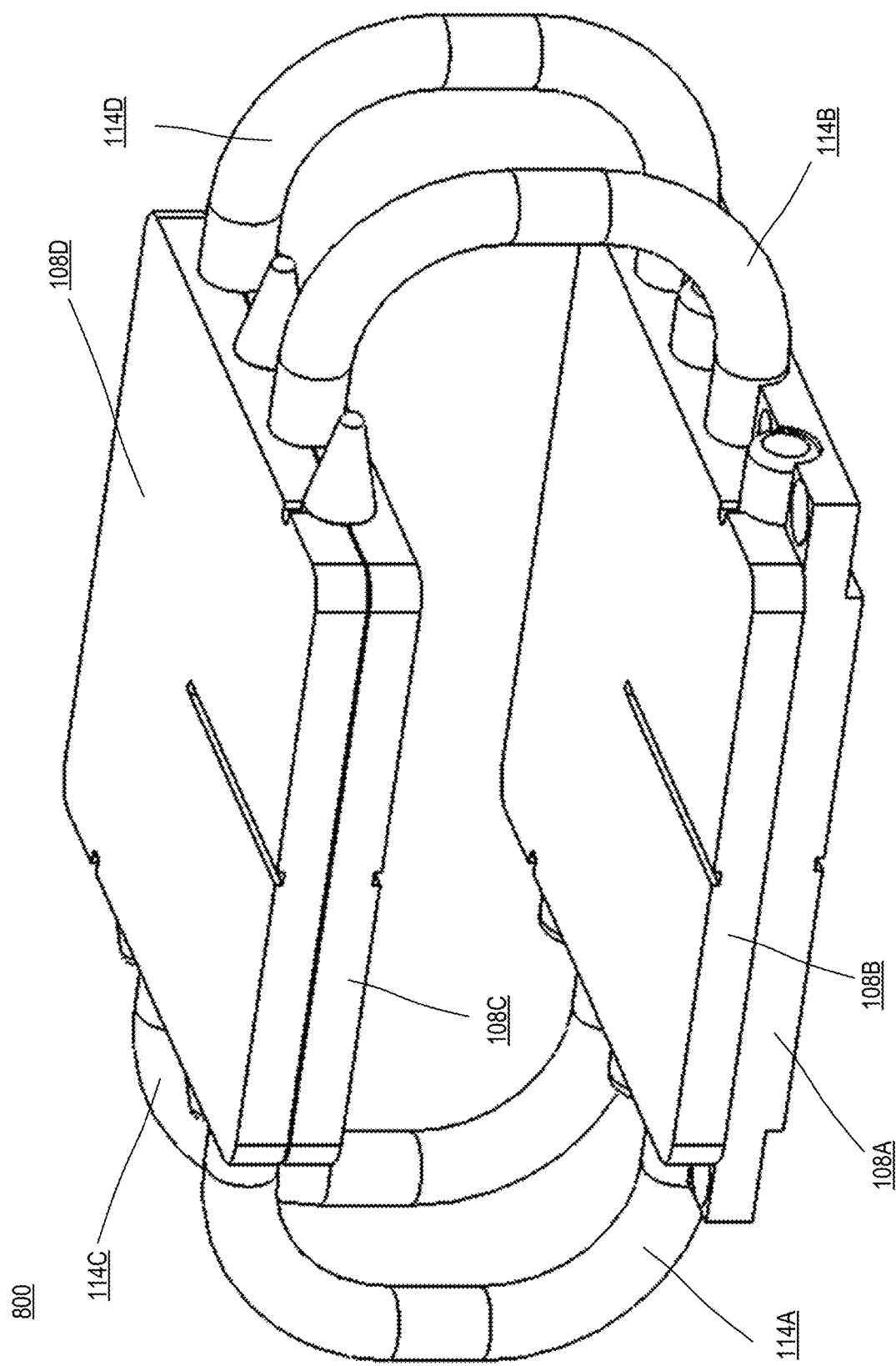
FIG. 8 is another implementation of a heat pipe assembly according to implementations of the present disclosure.

For further explanation, FIG. 8 shows another implementation of a heat pipe assembly 800 according to implementations of the present disclosure. The heat pipe assembly 800 includes the first heat pipe 114A, the second heat pipe 114B, the third heat pipe 114C, the fourth heat pipe 114D, the first base plate 108A, the second base plate 108B, the third base plate 108C, and the fourth base plate 108D. In the implementation illustrated in FIG. 8, the heat pipes 114A-114D have a substantially circular cross section. Each of the heat pipes 114A-114D include a first end in thermal contact with the first base plate 108A and the second base plate 108B, and a second end in thermal contact with the third base plate 108C and the fourth base plate 108D.

Figure 9:
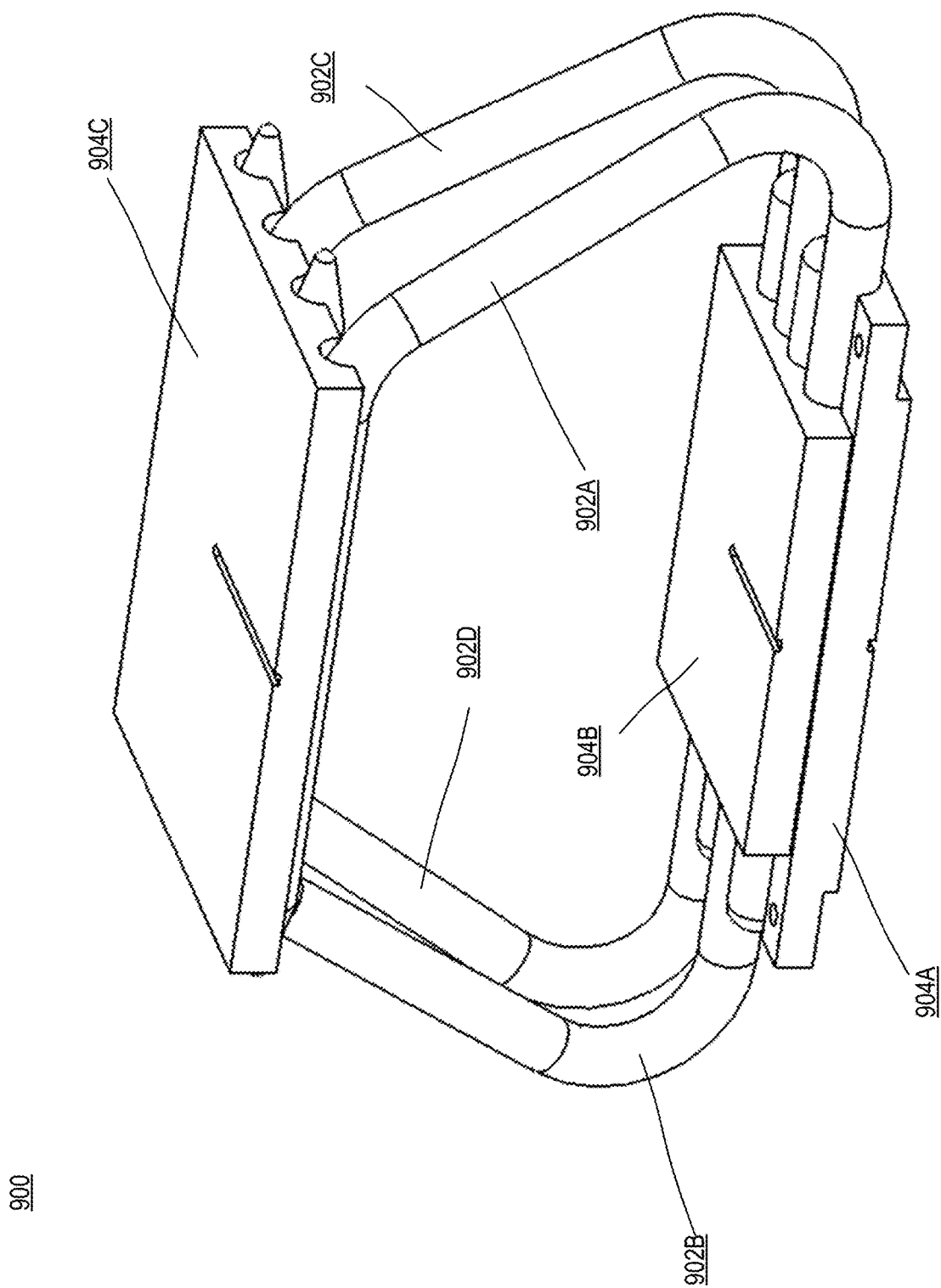
FIG. 9 is another implementation of a heat pipe assembly according to implementations of the present disclosure.

For further explanation, FIG. 9 shows another implementation of a heat pipe assembly 900 according to implementations of the present disclosure. The heat pipe assembly 900 includes a first heat pipe 902A, a second heat pipe 902B, a third heat pipe 902C, a fourth heat pipe 902D, a first base plate 904A, a second base plate 904B, and a third base plate 904C. In the implementation illustrated in FIG. 8, the heat pipes 902A-902D have a substantially circular cross section. In an implementation, the third base plate 904C has a larger surface area than those of the first base plate 904A and the second base plate 904B. Each of the heat pipes 902A-902D include a first end in thermal contact with the first base plate 904A and the second base plate 904B, and a second end in thermal contact with the third base plate 904C.

Figure 10:
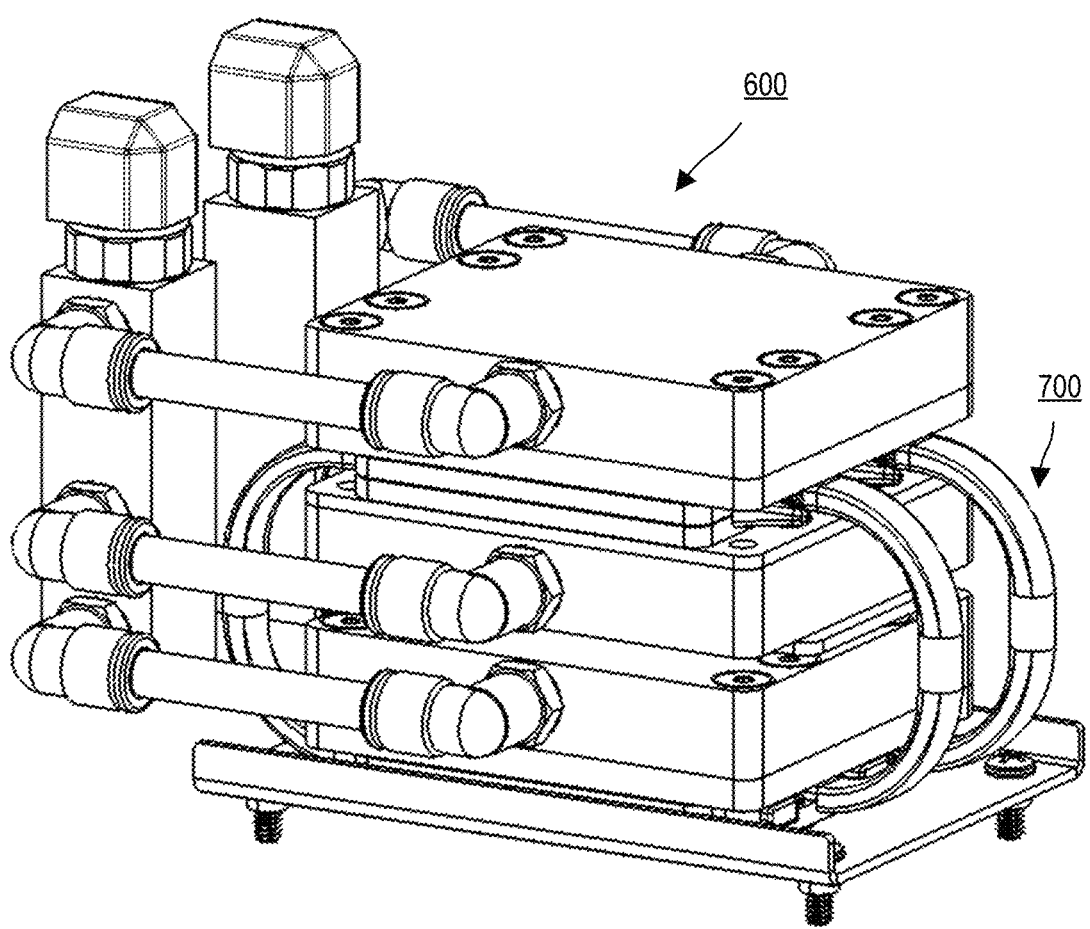
FIG. 10 is another example component cooling apparatus according to some implementations of the present disclosure.

For further explanation, FIG. 10 shows another example component cooling apparatus 1000 according to some implementations of the present disclosure. As shown in FIG. 10, the component cooling apparatus 1000 includes the fluid manifold 600 illustrated in FIG. 6 coupled with the heat pipe assembly 700 of FIG. 7.

Figure 11:
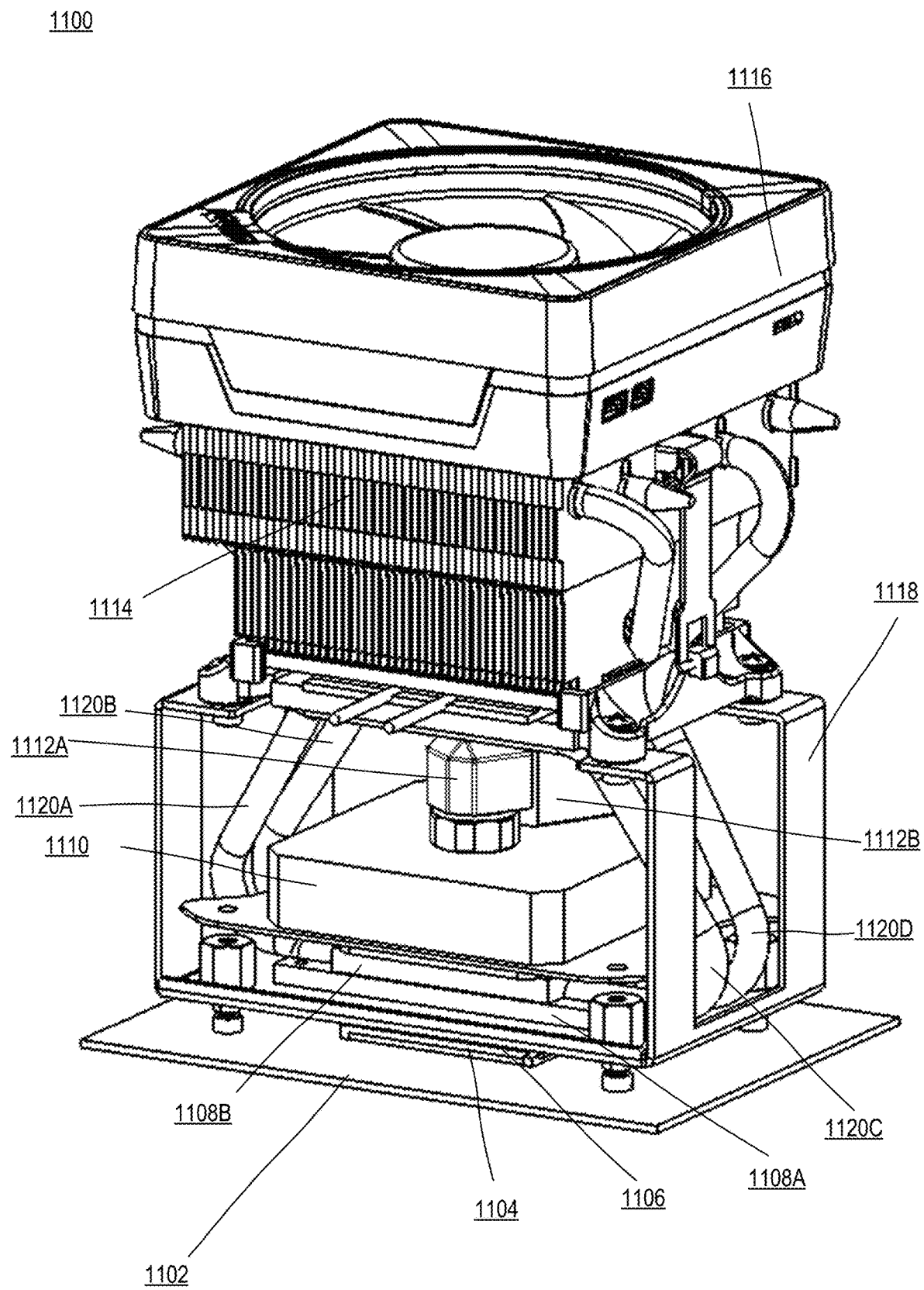
FIG. 11 is another example component cooling apparatus according to some implementations of the present disclosure.

For further explanation, FIG. 11 shows another example component cooling apparatus 1100 according to some implementations of the present disclosure. The example component cooling apparatus 1100 of FIG. 11 includes a substrate 1102 coupled to an IC socket 1104 which is further coupled to a processor 1106. The substrate 1102 includes, for example, a PCB such as a motherboard of a computing device. In various examples, the processor 1106 includes one or more of a CPU, an APU, a GPU, an FPGA, an ASIC, or a DSP. A top surface the processor 1106 is thermally coupled to a bottom surface of a first base plate 1108A. In an implementation, the first base plate 1108A is connected to the substrate 1102 via one or more standoffs. A top surface of the first base plate 1108A is coupled to a bottom surface of a second base plate 1108B. In one or more implementations, the first base plate 1108A and the second base plate 1108B are constructed of a conductive metal such as copper. In an implementation, the first base plate 1108A and the second base plate 1108B are replaced with a single base plate.

A top surface of the second base plate 1108B is thermally coupled to a bottom surface of a fluid block 1110. The fluid block 1110 includes a fluid inlet 1112A and a fluid outlet 1112B. The fluid block 1110 includes a fluid passage extending from the fluid inlet 1112A to the fluid outlet 1112B and in thermal contact with the second base plate 1108B. During operation of the component cooling apparatus 1100, a fluid loop including a fluid pump and a radiator (not shown) is coupled between the fluid inlet 1112A and the fluid outlet 1112B via tubing or the like. The fluid pump causes a flow of a heat transfer medium, such as water, within the fluid block 1110 from the fluid inlet 1112A to the fluid outlet 1112B to facilitate removal of heat from the second base plate 1108B to the radiator.

The component cooling apparatus 1100 further includes a heat sink fin stack 1114 having a top surface coupled to a bottom surface of a cooling fan assembly 1116 configured to direct an air flow to the heat sink fin stack 1114. In an implementation, the heat sink fin stack 1114 includes a plurality of fins to facilitate removal of heat from the heat sink fin stack 1114 via the air flow. The heat sink fin stack 1114 is supported from the substrate 1102 via a support frame 1118. In an implementation, the heat sink fin stack 1114 is substantially larger than either of the first base plate 1108A or the second base plate 1108B.

The component cooling apparatus 1100 further includes multiple heat pipes 1120A, 1120B, 1120C, and 1120D. Each of the heat pipes 1120A, 1120B, 1120C, and 1120D has a first end disposed between and in thermal contact with the first base plate 1108A and the second base plate 1108B, and a second end in thermal contact with the heat sink fin stack 1114. Each of the heat pipes 1120A, 1120B, 1120C, and 1120D include a middle portion between the first end and the second end that is external to each of the base plates 1108A, 1108B and the heat sink fin stack 1114.

In one or more implementations, each of the heat pipes 1120A, 1120B, 1120C, and 1120D are formed in a half-loop configuration. In the implementation illustrated in FIG. 11, the heat pipes 1120A-1120D have a substantially circular cross section. In a particular implementation, the heat pipes 1120A and 1120B extend from a side of the component cooling apparatus 1100, and the heat pipes 1120C and 1120D extend from an opposite side of the component cooling apparatus 1100. Although various implementations are described as using heat pipes as heat transfer structures, other implementations utilize other suitable heat transfer structures such as vapor chambers.

The example component cooling apparatus 1100 of FIG. 11 provides for multiple heat conduction paths between heat transfer elements for removal of heat generated by the processor 1106 as further described below. During operation of the processor 1106, an amount of heat generated by the processor 1106 is transferred to the first base plate 1108A thermally coupled to the processor 1106, and a portion of the heat transferred to the first base plate 1108A is transferred to the second base plate 1108B. Each of the heat pipes 1120A, 1120B, 1120C, and 1120D is configured to transfer a portion of the heat received from the first base plate 1108A and the second base plate 1108B to the heat sink fin stack 1114. The heat pipes 1120A, 1120B, 1120C, and 1120D employ a phase transition between a heat transfer fluid within the heat pipes 1120A, 1120B, 1120C, and 1120D to transfer heat from the first base plate 1108A and the second base plate 1108B to the heat sink fin stack 1114.

In another implementation the component cooling apparatus 1100 further includes a TEC positioned between and in thermal contact with the second base plate 1108B and the fluid block 1110. In another implementation, the component cooling apparatus 1100 further includes a TEC positioned between and in thermal contact with the heat sink fin stack 1114 and the cooling fan assembly 1116.

Figure 12:
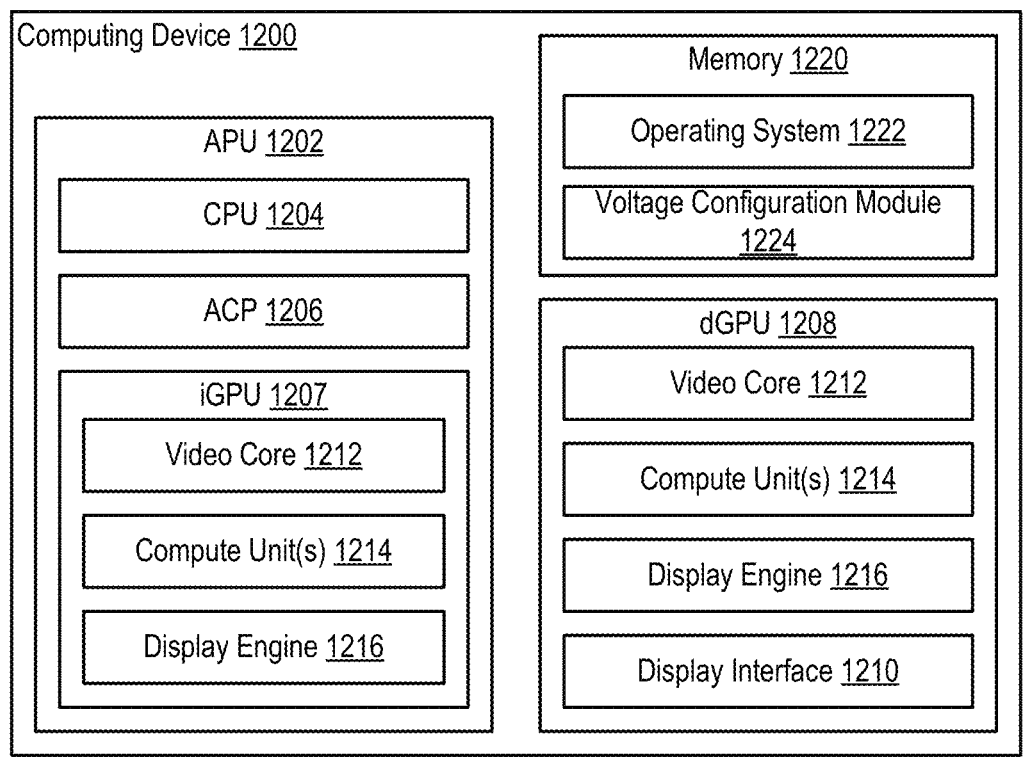
FIG. 12 is a block diagram of an example computing device for a component cooling apparatus according to some implementations.

FIG. 12 is a block diagram of an example computing device 1200 for a component cooling apparatus according to some implementations. The computing device 1200 includes an APU 1202. The APU 1202 is a microprocessor that includes a CPU 1204 and integrated graphics processing unit (iGPU) 1207 on a single die. The computing device 1200 also includes a discrete graphics processing unit (dGPU) 1208. Although the approaches set forth herein are described in the context of a computing device 1200 including a dGPU 1208 and an APU 1202 with an iGPU 1207, it is understood that the approaches set forth herein are applicable to any system or device incorporating both integrated and discrete GPUs. The dGPU 1208 is a peripheral or additional component of the computing device 1200 operatively coupled to the APU 1202. For example, in some implementations the dGPU 1208 is operatively coupled to the APU 1202 by a peripheral component interface express (PCIe) bus. Accordingly, in such an implementation, the dGPU 1208 is installed in a PCIe port on a motherboard or other PCB into which the APU 1202 is installed. By virtue of the operable connection between the APU 1202 and the dGPU 1208, the APU 1202 is capable of issuing instructions, rendering jobs, and the like, to the dGPU 1208. In some implementations, the dGPU 1208 includes a display interface 1210. The display interface 1210 is a port or socket to which an external monitor or display is connected. The display interface 1210 provides a video signal to the external display for presentation. The display interface 1210 includes, for example, a High Definition Multimedia Interface (HDMI) port, a Video Graphics Array (VGA) port, a Digital Visual Interface (DVI) port, a Universal Serial Bus C (USB-C) port, or other display port as can be appreciated.

The iGPU 1207 and dGPU 1208 each include one or more video cores 1212. A video core 1212 is a discrete processing unit, core, or other unit of hardware resources dedicated to encoding and decoding video data. For example, each video core 1212 facilitates video encoding or decoding operations such as decoding streaming video content, encoding video for video conferencing applications, encoding video files for later playback, and the like. In some implementations, the video core 1212 implements particular hardware architectures or configurations for video encoding and decoding, such as Video Core Next (VCN).

The iGPU 1207 and dGPU 1208 also each include one or more compute units 1214. Each compute unit 1214 includes one or more cores that share a local cache, allowing for parallel processing and cache access for each core within a given compute unit 1214. The compute units 1214 facilitate various calculations and processing jobs submitted to the iGPU 1207 and dGPU 1208, including rendering operations, machine learning operations, and the like.

The iGPU 1207 and dGPU 1208 also each include a display engine 1216. Each display engine 1216 manages the presentation of video or image content to a display of the computing device 1200 (e.g., an internal mobile device display or an external display coupled to a display interface 1210). In some implementations, the display engines 1216 implement display core technology such as Display Core Next (DCN) and the like. The APU 1202 also includes an audio co-processor (ACP) 1206. The ACP 1206 is a core, processor, or other allocation of hardware components dedicated to audio encoding and decoding.

The computing device 1200 also includes memory 1220 such as Random Access Memory (RAM). Stored in memory 1220 is an operating system 1222 and a voltage configuration module 1224. The operating system 1222 and voltage configuration module 1224 in the example of FIG. 12 are shown in memory 1220, but many components of such software typically are stored in non-volatile memory also, such as, for example, on a disk drive or other storage medium. Operating systems 1222 useful in the computing device 1200 according to certain implementations include UNIX™, Linux™, Microsoft Windows™, and others as will occur to those of skill in the art.

The voltage configuration module 1224 is a module for controlling the voltage allocated to the APU 1202 and dGPU 1208. For example, the voltage configuration module 1224 implements SmartShift technology to allocate voltage in order to increase performance for particular applications. Depending on the particular workload executed in the computing device 1200, the voltage configuration module 1224 increases or decreases the voltage used by the APU 1202 and dGPU 1208. As an example, for a workload that relies on the dGPU 1208 heavily, such as complex graphics rendering, the voltage configuration module 1224 will increase the voltage to the dGPU 1208. As another example, for a workload that relies on the APU 1202 more than the dGPU 1208 such as audio encoding, or when the computing device 1200 is in a low power consumption state, the voltage configuration module 1224 will increase the voltage to the APU 1202. In some implementations, an increase to the voltage of one component (e.g., to the APU 1202 and dGPU 1208) will cause or be performed in response to a decrease in the voltage of the other component.

In some implementations, a modification to the voltage of a given component will cause or be performed in response to a modification in operating frequency of the given component. For example, assume that a command or request is issued to increase the operating frequency of the dGPU 1208 in response to a rendering job being submitted to the dGPU 1208. The voltage configuration module 1224 will then increase the voltage provided to the dGPU 1208 so that the dGPU 1208 is able to operate at the increased frequency. In some implementations, the frequency of a given component is defined according to a frequency voltage curve. A frequency voltage curve defines a relationship between the frequency of a component and its corresponding voltage. In other words, the frequency voltage curve defines, for a given frequency, a corresponding voltage for the component.

One skilled in the art will appreciate that the voltage configuration module 1224 operates within various constraints for voltages in the computing device 1200. For example, in some implementations, the APU 1202 and dGPU 1208 have defined minimum and maximum safe voltages. One skilled in the art will appreciate that the particular voltage limits for the APU 1202 and dGPU 1208 are dependent on particular cooling and thermal solutions implemented in the computing device 1200.

One skilled in the art will also appreciate that the approaches described herein for a component cooler provide for increased cooling capabilities for the APU 1202 and dGPU 1208, allowing for increased maximum safe operational voltages for both the APU 1202 and dGPU 1208. Thus, a computational performance increase is achieved though the improved cooling approaches described herein.

Figure 13:
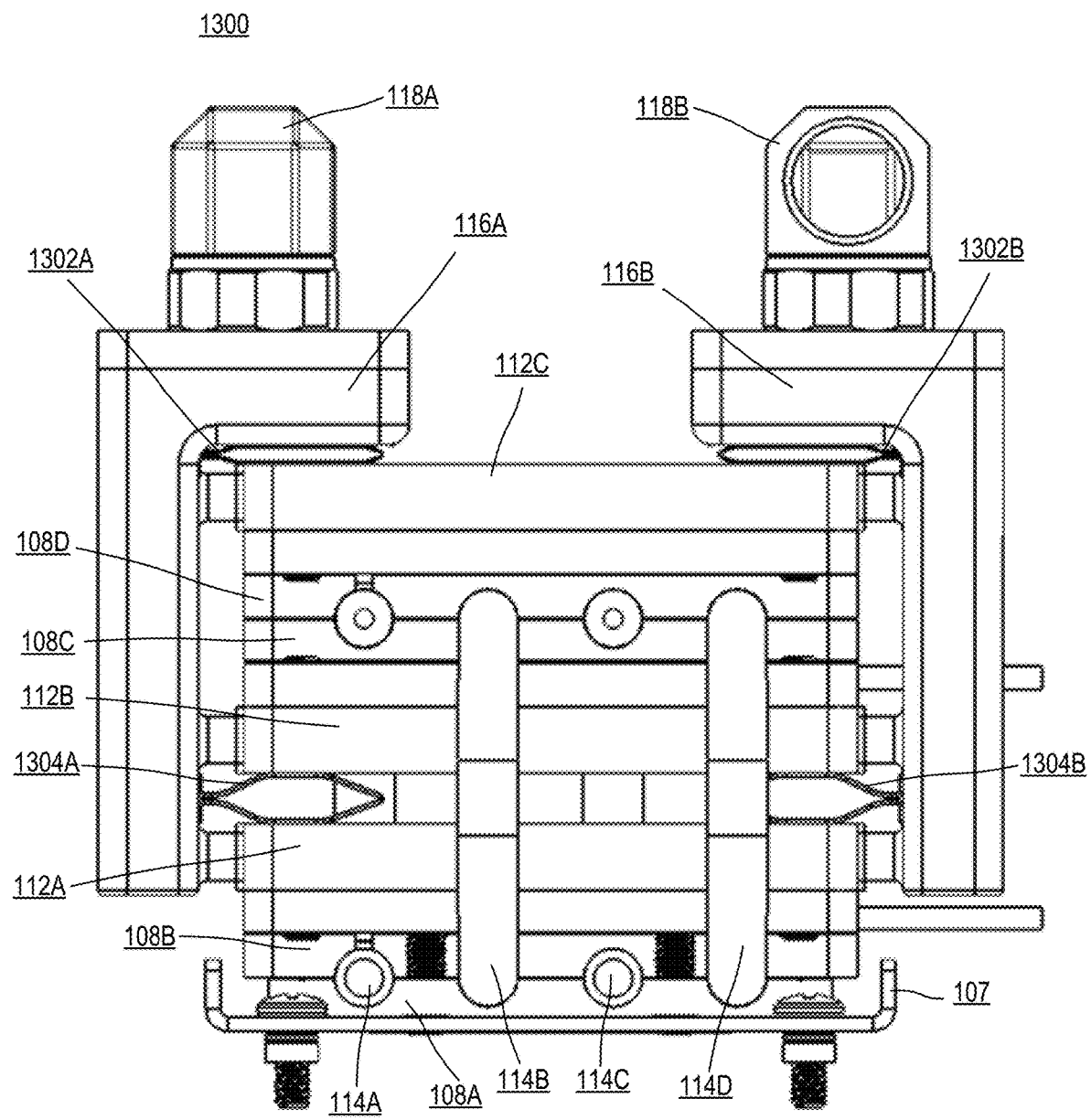
FIG. 13 is another example component cooling apparatus according to some implementations of the present disclosure.

FIG. 13 is another example component cooling apparatus 1300 according to some implementations of the present disclosure. The example component cooling apparatus 1300 of FIG. 13 is similar to the example component cooling apparatus 100 described with respect to FIGS. 1-5. However, the spring mechanisms in the example of FIG. 13 are different than those of FIGS. 1-5. More specifically, some of the spring mechanisms in the example of FIG. 13 have different widths as described below in greater detail. Although the implementation illustrated in FIG. 13 shows the spring mechanisms as having a leaf spring design, other implementations include other types of spring mechanisms or biasing mechanisms.

The component cooling apparatus 1300 of FIG. 13 includes a first spring mechanism 1302A disposed between the manifold inlet portion 116A and the third cold plate 112C, and a second spring mechanism 1302B disposed between the manifold outlet portion 116B and third cold plate 112C. The first and second spring mechanisms 1302A, 1302B are substantially the same width and have substantially the same spring constant so that, when compressed as in FIG. 13, the distance between the two components upon which each spring mechanism exerts force is substantially the same.

In the implementation, the first spring mechanism 1302A has an end that is attached to the manifold inlet portion 116A of the fluid manifold, and the second spring mechanism 1302B has an end that is attached to the manifold output portion 116B of the fluid manifold. The first spring mechanism 1302A and the second spring mechanism 1302B are each configured to exert an upward force upon the fluid manifold and a downward force on the third cold plate 112C when the first spring mechanism 1302A and the second spring mechanism 1302B are in a compressed state after assembly of the component cooling apparatus 1300. Accordingly, the third cold plate 112C maintains a thermal interface with the heat transfer element to which it is mated (e.g., the fourth base plate 108D).

The component cooling apparatus 1300 also includes a third spring mechanism 1304A and a fourth spring mechanism 1304B disposed between the second cold plate 112B and the first cold plate 112A. In the implementation, the third spring mechanism 1304A has an end that is attached to the manifold inlet portion 116A of the fluid manifold, and the fourth spring mechanism 1304B has an end that is attached to the manifold output portion 116B of the fluid manifold. The third spring mechanism 1304A and a fourth spring mechanism 1304B are configured to exert a downward force on the first cold plate 112A and an upward force on the second cold plate 112B when the third spring mechanism 1304A and the fourth spring mechanism 1304B after assembly of the component cooling apparatus. Accordingly, the first cold plate 112A and the second cold plate 112B maintain a thermal interface between the first cold plate 112A and their respective heat transfer elements and the second cold plate 112B.

The third and fourth spring mechanisms 1304A, 1304B are substantially the same width and have substantially the same spring constant so that, when compressed as in FIG. 13, the distance between the two components upon which each spring mechanism exerts force is substantially the same. In this example, however, the third and fourth spring mechanisms have a greater width than the first and second spring mechanisms. As such, the distance between the cold plates 112A and 112B, maintained by the exertion of force by the third and fourth spring mechanisms, is greater than the distance between the manifold inlet and outlet portions 116A, 116B and the third cold plate 112C. The gap created by the third and fourth spring mechanisms between the first and second cold plates provides additional airflow between the cold plates resulting in differing thermal characteristics (additional cooling through heat dissipation, for example) than a smaller gap.

When the manifold portions are installed on the component cooling apparatus 1300, the springs mechanisms apply pressure to the heat transfer elements (e.g., cold plates) to cause the heat transfer elements to maintain a proper thermal interface to their respective mating surfaces. The spring mechanisms function as an assembly tool to position the heat transfer elements (e.g., cold plates) into their proper positions during assembly. Being rigidly attached to the manifold, the spring mechanisms effectively define a location for the components upon which the spring mechanisms exert a force. During assembly of a cooling component apparatus like the one in FIG. 13, the cold plates may be generally free to move to some extent prior to installation of the manifold. The example spring mechanisms in FIG. 13 can be utilized to move the cold plates to their preferred position as the manifold is installed. Consider, for example, that the manifold inlet and outlet portions are installed to the component cooling apparatus of FIG. 13 by pressing the two towards the other. While pressing the two manifold portions towards the other, with the cold plates and heat pipe assembly in between, the tapered end of each spring mechanism enters the space between the two components upon which the spring mechanism will exert force when compressed. In the case of spring mechanisms 1304A and 1304B, for example, as the manifold is installed, the tapered ends of the spring mechanisms will, substantially concurrently, enter the space between the first and second cold plates. As the spring mechanisms move toward one another (the manifold portions continue to be pressed toward each other), the tapered ends are fully inserted between the cold plates and the spring mechanisms begin to compress and exert a force on the first and second cold plates. The forces exerted by the spring mechanism while being inserted in the space between the first and second cold plates, will move the first and second cold plates into their preferred positions and maintain that position when fully installed.

Figure 14A:
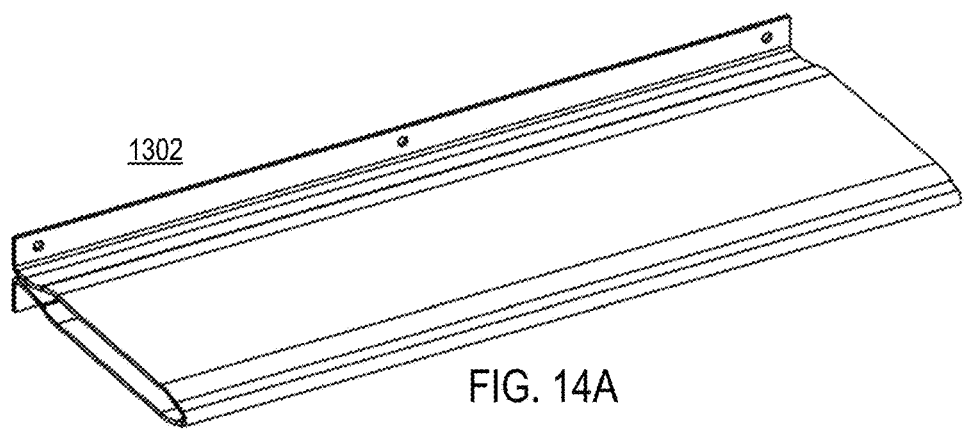
FIGS. 14A-14E illustrate an example spring mechanism of the component cooling apparatus of FIG. 13 according to some implementations of the present disclosure.
Figure 14B:
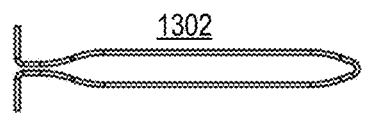
Figure 14C:
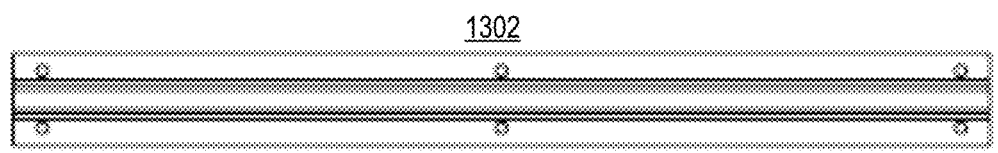
Figure 14D:
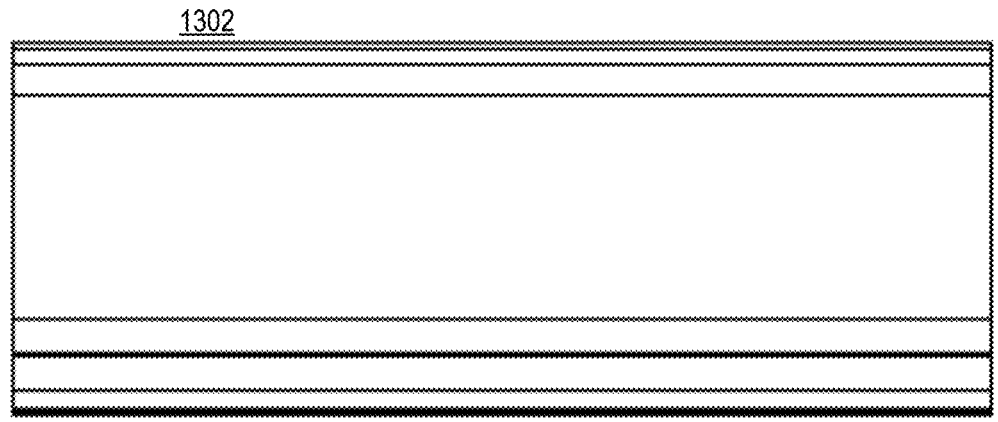
Figure 14E:
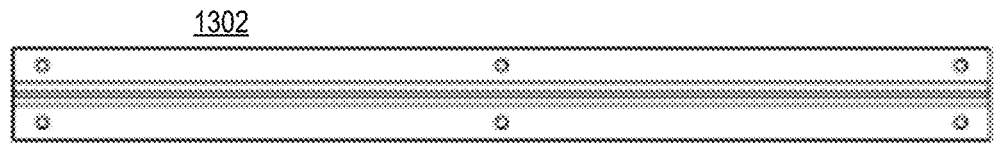

For further explanation, FIGS. 14A-14E illustrate an example spring mechanism 1302 of the component cooling apparatus 1300 of FIG. 13 according to some implementations of the present disclosure. FIG. 14A shows a perspective view of the spring mechanism 1302. FIG. 14B shows a profile view of the spring mechanism 1302. FIG. 14C shows a front view of the spring mechanism 1302. FIG. 14D shows a top view of the spring mechanism 1302. FIG. 14E shows a back view of the spring mechanism 1302. In one or more implementations, the spring mechanism 1302 is used as the first spring mechanism 1302A and the second spring mechanism 1302B of FIG. 13. In the implementation illustrated in FIGS. 14A-14E, the spring mechanism 1302 extends along an edge of the heat transfer element (e.g., cold plate) and has a back end configured to be attached to a portion of the fluid manifold. In a particular implementation, the spring mechanism 1302 extends along substantially an entire edge of the heat transfer element.

The spring mechanism of FIGS. 14A-14E also has a tapered end. The tapered end is opposite of the end that attaches to the fluid manifold. The tapered end enables the spring mechanism to be inserted into a space between two components (such as the manifold and a cold plate), where that space has a distance that is less than the width of the uncompressed spring mechanism. Said another way, the tapered end enables a spring mechanism to be inserted in a space that is smaller than the uncompressed spring mechanism. As the spring mechanism slides into the space, beginning with the tapered end, the spring mechanism is compressed and exerts force on the two components.

Figure 15A:
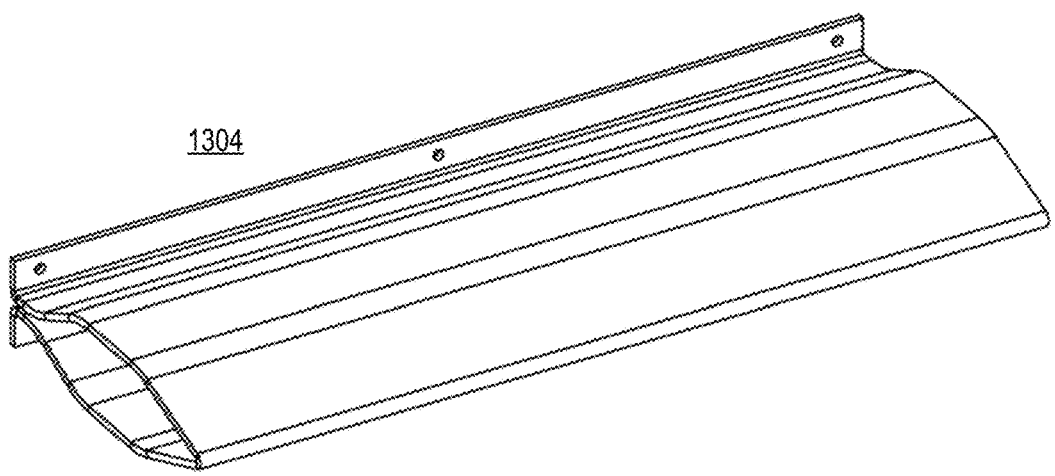
FIGS. 15A-15E illustrate an example spring mechanism of the component cooling apparatus of FIG. 13 according to some implementations of the present disclosure.
Figure 15B:
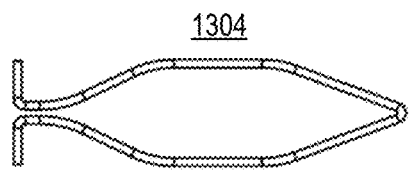
Figure 15C:
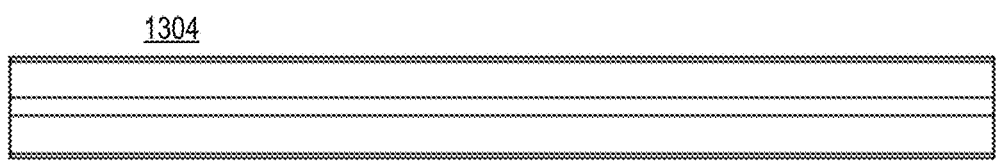
Figure 15D:
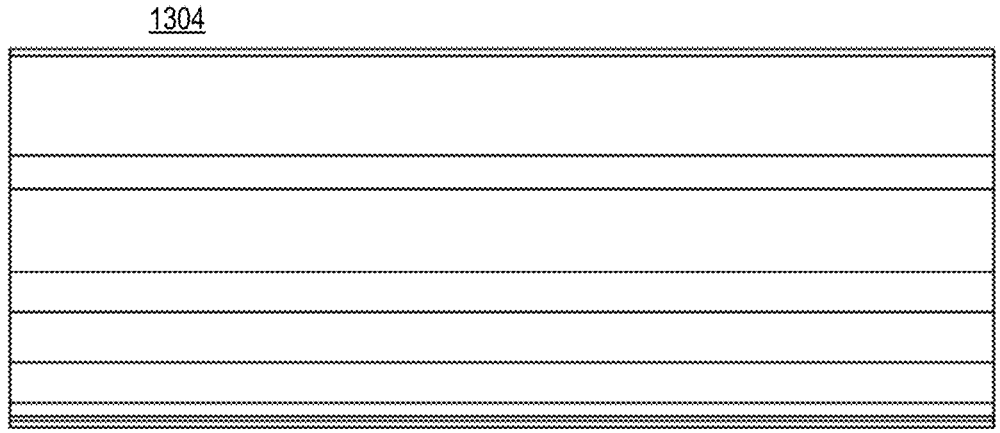
Figure 15E:
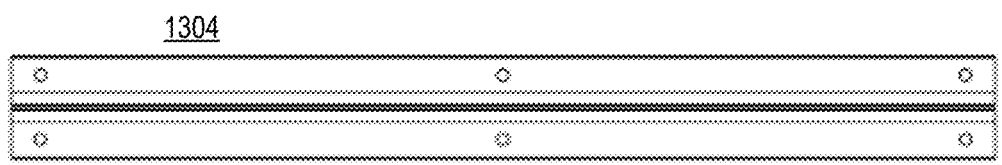

For further explanation, FIGS. 15A-15E illustrate an example spring mechanism 1304 of the component cooling apparatus 1300 of FIG. 13 according to some implementations of the present disclosure. FIG. 15A shows a perspective view of the spring mechanism 1304. FIG. 15B shows a profile view of the spring mechanism 1304. FIG. 15C shows a front view of the spring mechanism 1304. FIG. 15D shows a top view of the spring mechanism 1304. FIG. 15E shows a back view of the spring mechanism 1304. In one or more implementations, the spring mechanism 1304 is used as the third spring mechanism 1304A and the fourth spring mechanism 1304B of FIG. 13. In the implementation illustrated in FIGS. 15A-15E, the spring mechanism 1304 extends along an edge of the heat transfer element (e.g., cold plate) and has a back end configured to be attached to a portion of the fluid manifold. In a particular implementation, the spring mechanism 1304 extends along substantially an entire edge of the heat transfer element.

The spring mechanism of FIGS. 15A-15E also has a tapered end. The tapered end is opposite of the end that attaches to the fluid manifold. The tapered end enables the spring mechanism 1304 to be inserted into a space between two components (such as the cold plates 112A and 112B), where that space has a distance that is less than the width of the uncompressed spring mechanism. Said another way, the tapered end enables a spring mechanism to be inserted in a space that is smaller than the uncompressed spring mechanism. As the spring mechanism slides into the space, beginning with the tapered end, the spring mechanism is compressed and exerts force on the two components. In addition, during assembly of the component cooling apparatus, the cold plates may not be rigidly affixed and some minor play in movement may exist in the cold plates. Inserting a spring mechanism, tapered end first, on opposing sides of the cold plates, effectively moves and holds the cold plates in a desired position while the component cooling apparatus is assembled.

Figure 16:
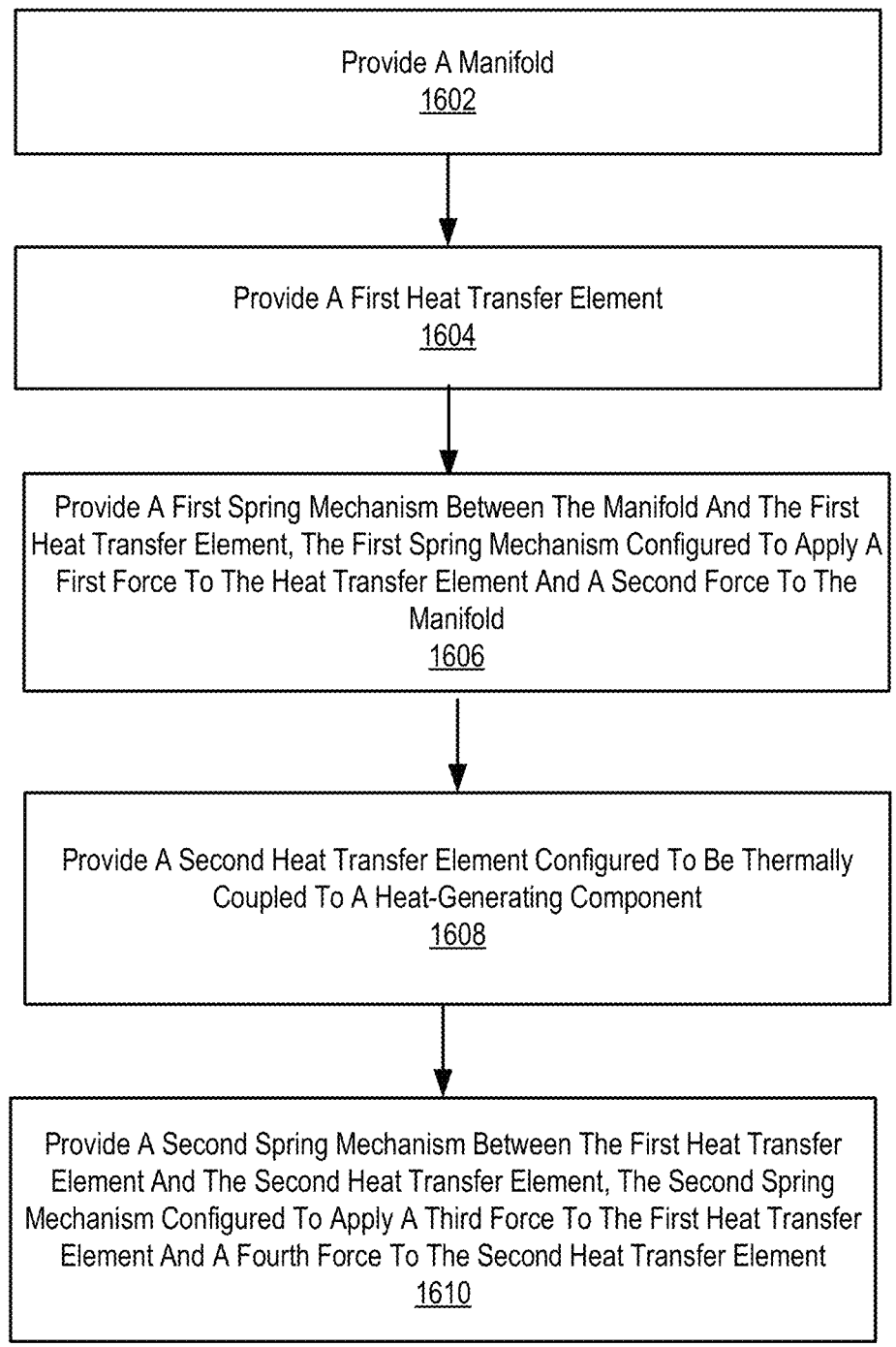
FIG. 16 sets forth a flow chart illustrating an example method for component cooling according to some implementations.

For further explanation, FIG. 16 sets forth a flow chart illustrating an example method for component cooling according to some implementations. In an implementation, the method includes providing 1602 a manifold, and providing 1604 a first heat transfer element. In an implementation, the method further includes providing 1606 a first spring mechanism between the manifold and the first heat transfer element, the first spring mechanism configured to apply a first force to the heat transfer element and a second force to the manifold. In an implementation, the method also includes providing 1608 a second heat transfer element configured to be thermally coupled to a heat-generating component. The method also includes providing 1610 a second spring mechanism between the first heat transfer element and the second heat transfer element, the second spring mechanism configured to apply a third force to the first heat transfer element and a fourth force to the second heat transfer element.

Figure 17:
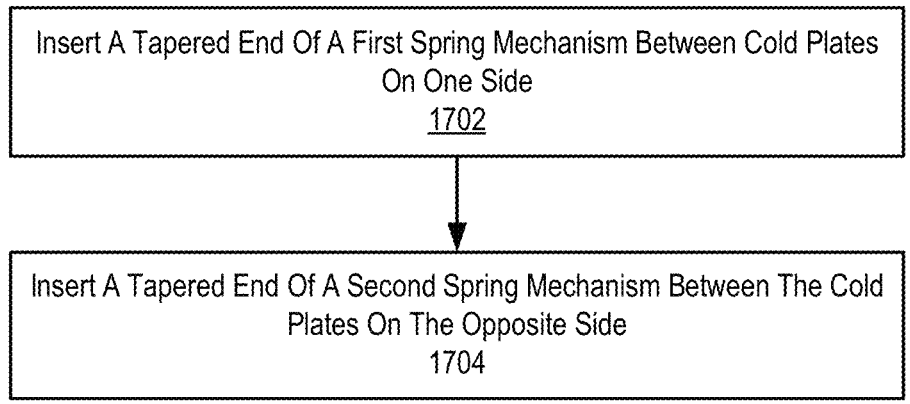
FIG. 17 sets forth a flow chart illustrating an example method of assembling a component cooling apparatus according to some implementations.

For further explanation, FIG. 17 sets forth a flow chart illustrating an example method of assembling a component cooling apparatus according to some implementations. In an implementation, the method includes inserting 1702, on a first side, a tapered end of a first spring mechanism into an opening between cold plates. The first spring mechanism is rigidly coupled on one end to a manifold inlet portion like those described above (for example manifold inlet portion 116A of FIG. 13). The end coupled to the manifold is opposite to that of the tapered end. The tapered end is inserted into a space between the cold plates (such as cold plates 112A, 112B of FIG. 13) when the manifold is installed during assembly of the component cooling apparatus. As the tapered end is fully inserted, the spring mechanism is compressed between the cold plates and exerts a force against the two cold plates, pushing the cold plates in opposite directions.

The method of FIG. 17 also includes inserting 1704 a tapered end of a second spring mechanism between the two cold plates on the opposite side of the cold plates from the first spring mechanism. The second spring mechanism is rigidly coupled to a manifold outlet portion (such as the manifold outlet portion 116B of FIG. 13). The tapered end of the second spring mechanism is opposite to the end coupled to the manifold outlet portion. When the manifold outlet portion is installed during assembly of the component cooling apparatus, the tapered end of the second spring mechanism is inserted in a space between the two cold plates on the opposite side of the cold plates from the first spring mechanism (similar to spring mechanism 1302B set forth in the example of FIG. 13). As the tapered end of the second spring mechanism is fully inserted, the second spring mechanism is compressed between the cold plates and exerts a force against the two cold plates, pushing the cold plates in opposite directions.

The result of inserting the first spring mechanism between the two cold plates on one side and inserting the second spring mechanism between the two cold plates on an opposite side, is that the distance between the cold plates is substantially equal across the entire width and length of the cold plates. Additionally, in implementations where one or both of the cold plates is generally free to move prior to assembly of the component cooling apparatus, the spring mechanisms position the cold plates in a defined manner during installation of the manifold and hold the cold plates in that position after installation of the manifold.

Exemplary implementations of the present disclosure are described largely in the context of a fully functional computer system for a component cooler for computing devices. Readers of skill in the art will recognize, however, that the present disclosure also can be embodied in a computer program product disposed upon computer readable storage media for use with any suitable data processing system. Such computer readable storage media can be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the disclosure as embodied in a computer program product. Persons skilled in the art will also recognize that, although some of the exemplary implementations described in this specification are oriented to software installed and executing on computer hardware, nevertheless, alternative implementations implemented as firmware or as hardware are well within the scope of the present disclosure.

The present disclosure can be a system, a method, and/or a computer program product. The computer program product can include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure can be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some implementations, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to implementations of the disclosure. It will be understood that each block of the flowchart illustrations and/or block diagrams, and combinations of blocks in the flowchart illustrations and/or block diagrams, can be implemented by computer readable program instructions.

These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks.

The computer readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various implementations of the present disclosure. In this regard, each block in the flowchart or block diagrams can represent a module, segment, or portion of instructions, which includes one or more executable instructions for implementing the specified logical function(s). In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes can be made in various implementations of the present disclosure. The descriptions in this specification are for purposes of illustration only and are not to be construed in a limiting sense. The scope of the present disclosure is limited only by the language of the following claims.

What is claimed is:

1. An apparatus for component cooling, comprising:
a manifold comprising a manifold inlet portion configured to provide a heat transfer medium to a first side of a heat transfer element and a manifold outlet portion configured to receive the heat transfer medium at a second side of the heat transfer element opposite the first side;
wherein the heat transfer element is configured to be thermally coupled to a heat-generating component;
a first spring mechanism between the manifold inlet portion and the heat transfer element, the first spring mechanism configured to apply a first force to the heat transfer element; and
a second spring mechanism between the manifold outlet portion and the heat transfer element, the second spring mechanism configured to apply a second force to the heat transfer element.

2. The apparatus of claim 1, wherein the first spring mechanism is attached to the manifold.

3. The apparatus of claim 2, wherein the first spring mechanism is attached to the manifold inlet portion.

4. The apparatus of claim 1, wherein the first spring mechanism extends along a portion of a first edge of the heat transfer element.

5. The apparatus of claim 1, wherein the first spring mechanism comprises a leaf spring.

6. The apparatus of claim 1, wherein the manifold inlet portion is separate from the manifold outlet portion.

7. The apparatus of claim 1, wherein the second spring mechanism is attached to the manifold.

8. The apparatus of claim 7, wherein the second spring mechanism is attached to the manifold outlet portion.

9. The apparatus of claim 8, wherein the first spring mechanism and the second spring mechanism comprise substantially a same width and spring constant such that a distance between the manifold inlet portion and the heat transfer element is substantially equal to a distance between the manifold outlet portion and the heat transfer element when the first spring mechanism and the second spring mechanism are installed and compressed.

10. The apparatus of claim 1, wherein the second spring mechanism extends along a portion of a second edge of the heat transfer element.

11. The apparatus of claim 1, wherein the heat transfer element comprises a cold plate.

12. An apparatus for component cooling, comprising:
a first heat transfer element configured to be thermally coupled to a heat-generating component;
a second heat transfer element of a same type as the first heat transfer element; and
a first spring mechanism between the first heat transfer element and the second heat transfer element, the first spring mechanism configured to apply a first force to the first heat transfer element and a second force to the second heat transfer element, wherein the first spring mechanism comprises a tapered end, and wherein the first spring mechanism is attached to a manifold at a first end opposite to the tapered end.

13. The apparatus of claim 12, wherein the first force presses the first heat transfer element against the heat-generating component and the second force presses the second heat transfer element against a base plate.

14. The apparatus of claim 12, wherein the first spring mechanism comprises a width, when uncompressed, greater than a distance of a space between the first and second heat transfer elements, wherein the tapered end is adapted to enter the space between the first and second heat transfer elements during installation of the manifold, and the first spring mechanism positions the first and second heat transfer elements when compressed, after the tapered end is completely within the space.

15. The apparatus of claim 12, wherein the first heat transfer element is a first cold plate and the second heat transfer element is a second cold plate.

16. An apparatus for component cooling, comprising:
a manifold;
a first heat transfer element;
a first spring mechanism between the manifold and the first heat transfer element, the first spring mechanism configured to apply a first force to the first heat transfer element and a second force to the manifold;
a second heat transfer element configured to be thermally coupled to a heat-generating component; and
a second spring mechanism between the first heat transfer element and the second heat transfer element, the second spring mechanism configured to apply a third force to the first heat transfer element and a fourth force to the second heat transfer element.

17. The apparatus of claim 16, wherein the first spring mechanism and the second spring mechanism are attached to the manifold.

18. The apparatus of claim 16, wherein the first spring mechanism and the second spring mechanism comprise different widths so that a distance between the manifold and first heat transfer element defined by the first and second forces exerted by the first spring mechanism is different than a distance between the first and second heat transfer element defined by the third and fourth forces exerted by the second spring mechanism.

19. A method of assembling a component cooling apparatus, the method comprising:
inserting, on a first side, a tapered end of a first spring mechanism into an opening between a first cold plate and a second cold plate, the tapered end of the first spring mechanism opposite to an end attached to a manifold inlet portion; and
inserting, on a second side opposite the first side, a tapered end of a second spring mechanism into the opening between the first cold plate and the second cold plate, the tapered end of the second spring mechanism attached to a manifold outlet portion.

* * * * *